United States Patent
Nakayama et al.

(10) Patent No.: US 11,889,601 B2
(45) Date of Patent: Jan. 30, 2024

(54) SPECTRUM CONTROL DEVICE, NON-TRANSITORY COMPUTER READABLE MEDIUM, AND DATA STRUCTURE

(71) Applicant: KYOCERA Corporation, Kyoto (JP)

(72) Inventors: Nobuyoshi Nakayama, Kyoto (JP); Takayuki Kimura, Kyoto (JP); Hidetaka Katou, Kyoto (JP)

(73) Assignee: KYOCERA Corporation, Kyoto (JP)

( * ) Notice: Subject to any disclaimer, the term of this patent is extended or adjusted under 35 U.S.C. 154(b) by 259 days.

(21) Appl. No.: 17/418,463

(22) PCT Filed: Dec. 25, 2019

(86) PCT No.: PCT/JP2019/050824
§ 371 (c)(1),
(2) Date: Jun. 25, 2021

(87) PCT Pub. No.: WO2020/138169
PCT Pub. Date: Jul. 2, 2020

(65) Prior Publication Data
US 2022/0095436 A1 Mar. 24, 2022

(30) Foreign Application Priority Data

Dec. 26, 2018 (JP) ................................ 2018-242955

(51) Int. Cl.
*H05B 45/22* (2020.01)
*H05B 47/11* (2020.01)

(52) U.S. Cl.
CPC ............. *H05B 47/11* (2020.01); *H05B 45/22* (2020.01)

(58) Field of Classification Search
CPC ........ H05B 45/10; H05B 45/20; H05B 45/22; H05B 47/10; H05B 47/11
See application file for complete search history.

(56) References Cited

U.S. PATENT DOCUMENTS

| 10,056,018 | B1* | 8/2018 | Laski .................... F21S 10/066 |
| 2005/0030744 | A1 | 2/2005 | Ducharme et al. |
| 2017/0050561 | A1* | 2/2017 | Lickfelt ................. H04N 7/183 |
| 2017/0142809 | A1 | 5/2017 | Paolini et al. |

FOREIGN PATENT DOCUMENTS

| CN | 102428356 A | * | 4/2012 | ................ G01J 3/02 |
| EP | 1234140 A2 | | 8/2002 | |
| JP | 2004-166511 A | | 6/2004 | |
| JP | 2011-526414 A | | 10/2011 | |
| JP | 2012-159945 A | | 8/2012 | |
| JP | 2018-041856 A | | 3/2018 | |
| WO | 01/36864 A2 | | 5/2001 | |

* cited by examiner

*Primary Examiner* — Jimmy T Vu
(74) *Attorney, Agent, or Firm* — Volpe Koenig

(57) ABSTRACT

A spectrum control device includes a control unit that obtains spectrum information. The control unit controls at least one of a spectrum of light emitted by a light emitting device or a spectrum of image light that forms an image, on the basis of the spectrum information.

18 Claims, 18 Drawing Sheets

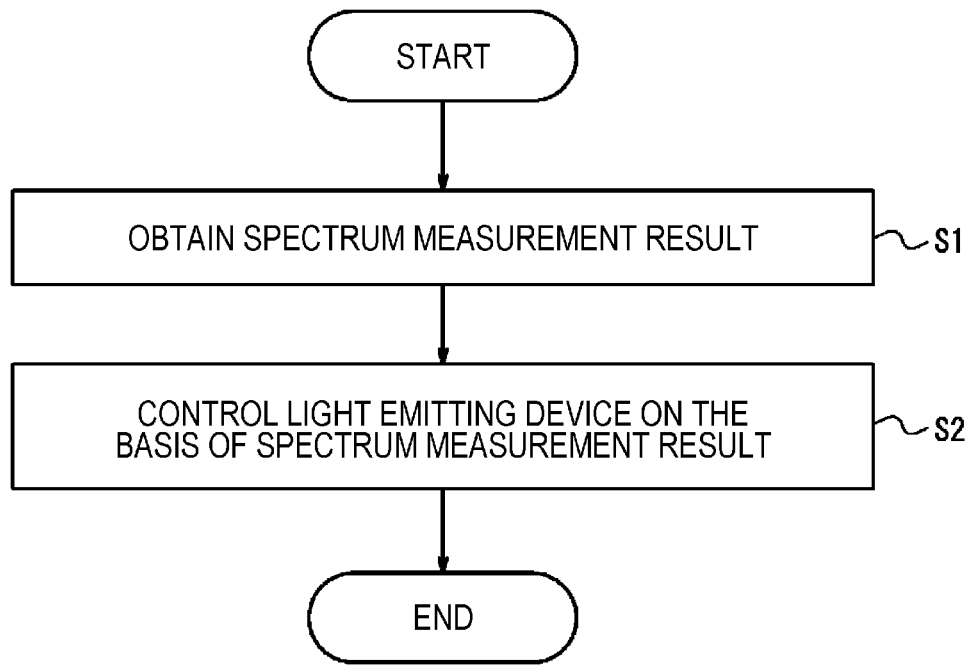
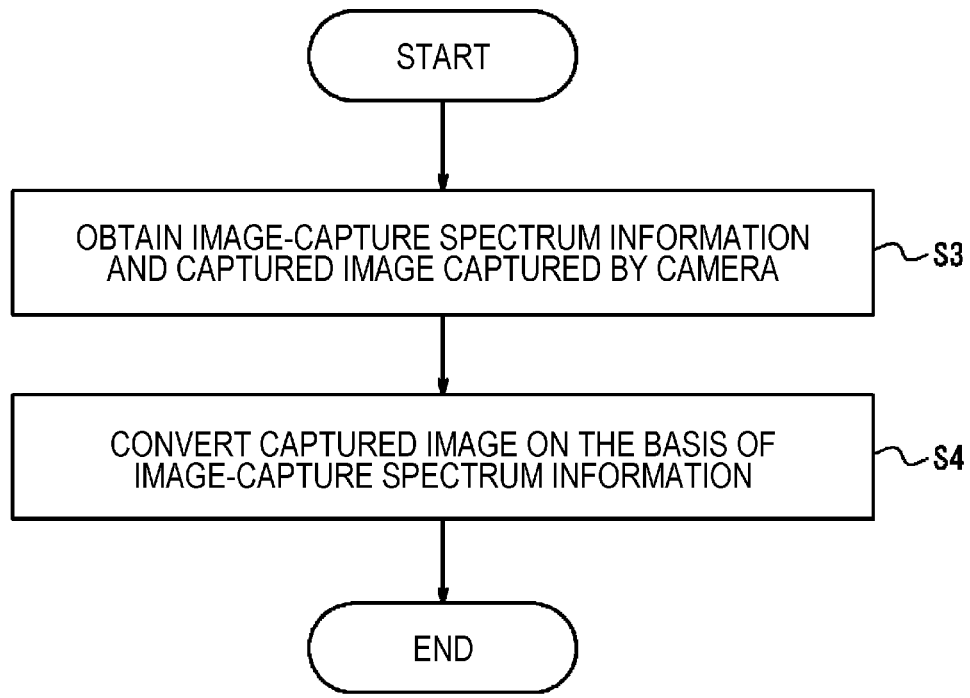

FIG. 4

| SPECTRUM MEASUREMENT RESULT | MEASUREMENT DATE | MEASUREMENT TIME | MEASUREMENT POSITION | WEATHER |
|---|---|---|---|---|
| S_1 | yyyy/mm/dd | hh:mm:ss | X DEGREES EAST LONGITUDE, Y DEGREES NORTH LATITUDE | FINE |
| S_2 | yyyy/mm/dd | hh:mm:ss | X DEGREES EAST LONGITUDE, Y DEGREES SOUTH LATITUDE | CLOUDY |
| S_3 | yyyy/mm/dd | hh:mm:ss | X DEGREES WEST LONGITUDE, Y DEGREES NORTH LATITUDE | SNOWY |
| ... | ... | ... | ... | ... |
| S_N | yyyy/mm/dd | hh:mm:ss | X DEGREES WEST LONGITUDE, Y DEGREES SOUTH LATITUDE | RAINY |

SPECTRUM CONTROL DEVICE, NON-TRANSITORY COMPUTER READABLE MEDIUM, AND DATA STRUCTURE

CROSS-REFERENCE TO RELATED APPLICATION

The present application claims priority to Japanese Patent Application No. 2018-242955 (filed on Dec. 26, 2018), the disclosure of which is incorporated herein by reference in its entirety.

TECHNICAL FIELD

The present disclosure relates to a spectrum control device, a spectrum control program, and a data structure.

BACKGROUND ART

A known configuration allows an observer to identify the shade of color of a visual check target more accurately by illuminating the visual check target with lighting that emits light having a spectrum close to that of sunlight (see, for example, PTL 1).

CITATION LIST

Patent Literature

PTL 1: Japanese Unexamined Patent Application Publication No. 2018-41856

SUMMARY OF INVENTION

A spectrum control device according to one embodiment of the present disclosure includes a control unit that obtains a spectrum measurement result regarding measurement target light. The control unit controls at least one of a spectrum of light emitted by a light emitting device or a spectrum of image light that forms an image, on the basis of the spectrum measurement result.

A spectrum control program according to one embodiment of the present disclosure causes a processor to perform a step of obtaining a spectrum measurement result regarding measurement target light. The spectrum control program causes the processor to perform a step of controlling at least one of a spectrum of light emitted by a light emitting device or a spectrum of image light that forms an image, on the basis of the spectrum measurement result.

A data structure according to one embodiment of the present disclosure is used for a processor to control a light emitting device. The data structure includes spectrum data in which a spectrum measurement result regarding measurement target light and measurement environment information for identifying an environment in which the spectrum measurement result is obtained are associated with each other. The processor controls at least one of a spectrum of light emitted by the light emitting device or a spectrum of image light that forms an image, on the basis of the spectrum data.

BRIEF DESCRIPTION OF DRAWINGS

FIG. 2 is a flowchart illustrating an example procedure for controlling the spectrum of light to be emitted by a light emitting device on the basis of a spectrum measurement result.

FIG. 3 is a flowchart illustrating an example procedure for converting the spectrum of image light of a captured image on the basis of a spectrum measurement result.

FIG. 4 is a table illustrating an example of a data structure according to one embodiment.

DESCRIPTION OF EMBODIMENTS

The spectrum of sunlight varies under various conditions. For example, the spectra of sunlight in different regions are different. When an observer observes a visual check target illuminated with light rays having various different spectra including the spectrum of sunlight, the observer may feel that the shade of color of the visual check target looks different. There has been a demand for providing an environment illuminated with light rays having various different spectra.

An object of the present disclosure is to provide a spectrum control device, a spectrum control program, and a data structure with which an environment illuminated with light rays having various different spectra or images generated with light rays having various different spectra can be provided.

Figure 1:
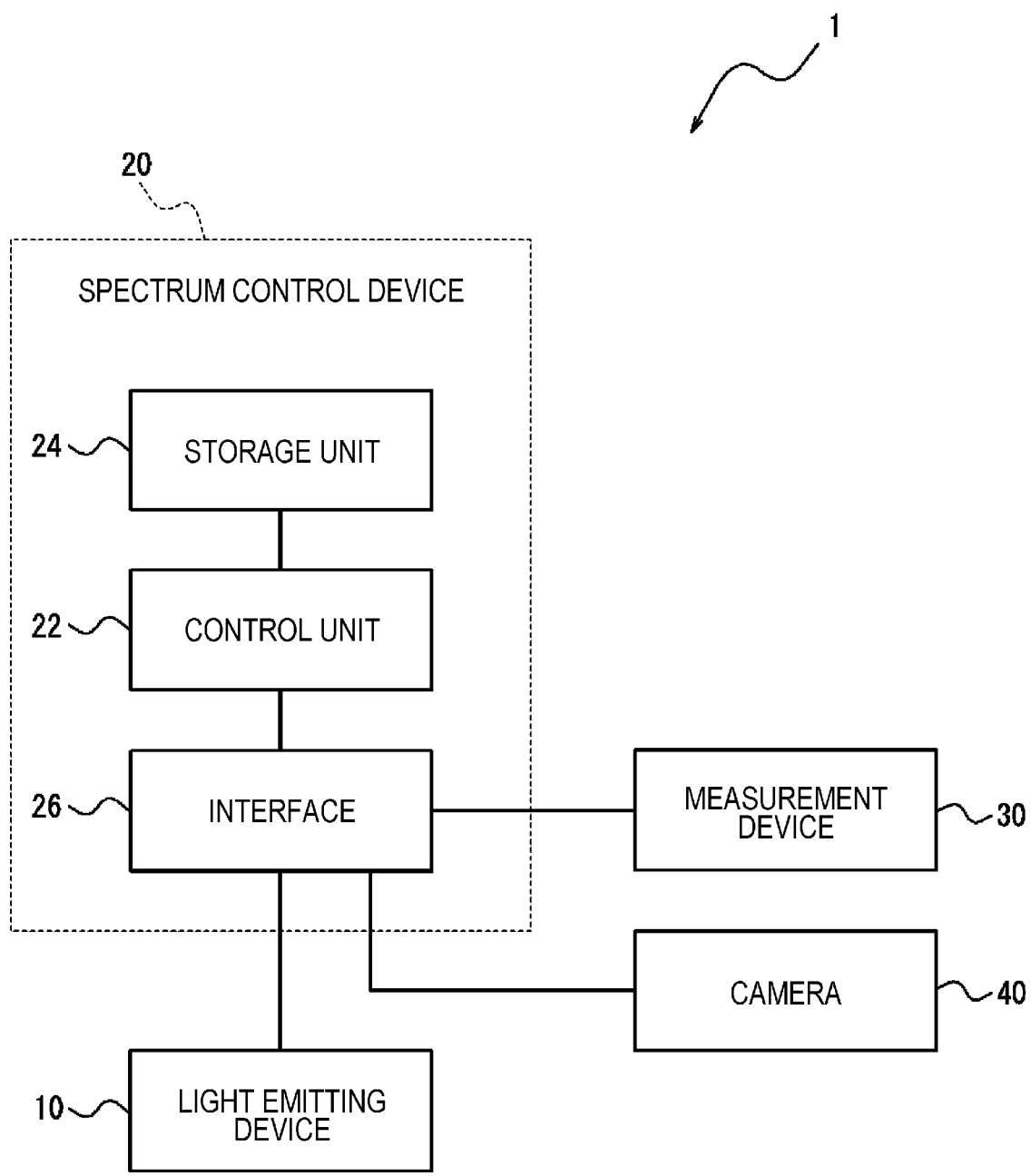
FIG. 1 is a block diagram illustrating an example configuration of a spectrum control system according to one embodiment.

As illustrated in FIG. 1, a spectrum control system 1 according to one embodiment includes a spectrum control device 20 and a measurement device 30. The spectrum control device 20 may include the measurement device 30. The spectrum control system 1 may further include a light emitting device 10. The spectrum control device 20 may include the light emitting device 10. The spectrum control system 1 may further include a camera 40. The spectrum control device 20 may include the camera 40. The spectrum control device 20 is communicably connected to the measurement device 30, the light emitting device 10, and the camera 40.

The spectrum control device 20 includes a control unit 22, a storage unit 24, and an interface 26.

The control unit 22 outputs a control instruction to the constituent units of the spectrum control device 20 and obtains various types of information from the constituent units. The control unit 22 may include at least one processor in order to provide control and a processing capacity for executing various functions. The processor can execute a program for implementing various functions of the control unit 22. The processor may be implemented as a single integrated circuit. The integrated circuit is also called an IC. The processor may be implemented as a plurality of integrated circuits and discrete circuits that are communicably connected to each other. The processor may be implemented on the basis of other various known techniques.

The storage unit 24 may include an electromagnetic storage medium, such as a magnetic disk, and may include a memory, such as a semiconductor memory or a magnetic memory. The storage unit 24 stores, for example, various types of information and the program executed by the control unit 22. The storage unit 24 may function as a work memory of the control unit 22. At least part of the storage unit 24 may be included in the control unit 22.

The interface 26 accepts input of a signal from a constituent device, such as the measurement device 30 or the light emitting device 10, connected thereto and outputs information based on the input signal to the control unit 22. The interface 26 outputs a signal based on information input from the control unit 22 to a constituent device connected thereto. The interface 26 may be communicably connected to other constituent devices by wire or wirelessly. The interface 26 may include a communication interface for, for example, a LAN (local area network). The interface 26 may implement communication conforming to any of the various communication methods, such as 4G (4th Generation) or 5G (5th Generation), or LTE (Long Term Evolution). The interface 26 may include a communication interface for contactless communication, such as infrared communication or NFC (Near-Field Communication). The interface 26 may include a port via which a signal based on a serial communication standard, such as RS232C or RS485, can be input and output.

The spectrum control device 20 may be implemented as one of the functions of, for example, a communication terminal, such as a smartphone or a feature phone, or a mobile personal computer (PC), such as a tablet PC or a laptop PC.

The measurement device 30 measures the spectrum of light with which an environment in which the measurement device 30 is located is illuminated. The measurement device 30 may include a spectrometer capable of measuring the energy of light at each wavelength. The spectrum of light is identified with the relative intensity at each wavelength. That is, the spectrum of light is represented as a distribution of the intensity of light at each wavelength. A wavelength at which the relative intensity of light reaches its maximum is called the peak wavelength of the light. The relative intensity is expressed as the ratio of an intensity to the intensity at the peak wavelength.

Light that is a measurement target of the measurement device is also called measurement target light. An environment illuminated with measurement target light is also called a measurement environment. The spectrum of measurement target light measured by the measurement device 30 is also called a spectrum measurement result. The spectrum measurement result is included in spectrum information for identifying the spectrum of light. The spectrum measurement result corresponds to spectrum information for identifying the spectrum of measurement target light. The measurement device 30 measures the radiant energies of light rays having various wavelengths included in measurement target light for each wavelength and calculates the relative intensity of a light ray having each wavelength. The measurement device 30 may measure the radiant energy throughout the entire wavelength range of measurement target light. In this embodiment, it is supposed that the measurement device 30 measures the radiant energy of a light ray having each wavelength included in a wavelength range of 360 nm to 780 nm and calculates the relative intensity of the light ray having the wavelength. Light having its peak wavelength in a wavelength range of 360 nm to 780 nm is also called visible light. A wavelength range of 360 nm to 780 nm is also called a visible light range. The spectrum measurement result includes the relative intensity of a light ray having each wavelength in the visible light range. The measurement device 30 outputs the spectrum measurement result to the control unit 22. The control unit 22 obtains the spectrum measurement result from the measurement device 30 as spectrum information. The measurement device 30 may measure and output to the control unit 22, the illuminance of measurement target light.

The measurement device 30 may be mounted in, for example, a communication terminal or a mobile PC.

The camera 40 captures an image of a subject and outputs the captured image to the control unit 22. An image of a subject captured by the camera 40 is also called a captured image. The camera 40 may include an imaging element. The imaging element may include, for example, a CMOS (complementary metal-oxide semiconductor) image sensor or a CCD (charge-coupled device).

The captured image includes information regarding the spectrum of light with which the subject is illuminated. The control unit 22 may calculate the spectrum of light with which the subject present in the captured image is illuminated, on the basis of the captured image.

The coloring of a subject present in a captured image can be expressed by the ratio of the intensities of a plurality of different primary colors. The coloring of a subject is expressed by, for example, the ratio of the intensities of three primary colors of RGB (red, green, and blue). The control unit 22 may calculate the spectrum of light with which a subject is illuminated, on the basis of the ratio of the intensities of the primary colors that express the coloring of the subject. The control unit 22 may use a subject, among subjects present in a captured image, whose light reflectance for each primary color is known to calculate the spectrum. The control unit 22 may, for example, extract a subject that reflects a light ray of each primary color with the same reflectance from a captured image and calculate the spectrum of light with which the subject is illuminated, on the basis of the ratio of the intensities of the primary colors that express the coloring of the subject.

The control unit 22 may regard light with which a subject present in a captured image is illuminated as measurement target light and may regard a spectrum calculated on the basis of the captured image as a spectrum measurement result.

<Spectrum Control by Light Emitting Device>

The light emitting device 10 can emit light rays having various spectra as described below. The control unit 22 may generate and output control information for controlling the spectrum of light to be emitted by the light emitting device 10. The control unit 22 may generate and output control information for causing the light emitting device 10 to emit light having a spectrum the same as or similar to the spectrum of measurement target light, on the basis of a spectrum measurement result regarding the measurement target light. Control information, generated on the basis of a spectrum measurement result regarding measurement target light, for causing the light emitting device 10 to emit light having a spectrum the same as or similar to the spectrum of the measurement target light is also called light emission control information. That is, when the control unit 22 outputs light emission control information to the light emitting device 10, the light emitting device 10 can emit light having a spectrum the same as or similar to the spectrum of measurement target light. Accordingly, the spectrum control system 1 can reproduce an environment the same as or similar to an environment illuminated with measurement target light.

The control unit 22 may obtain from the measurement device 30 located at a specific point, a spectrum measurement result regarding light with which the point is illuminated and output light emission control information to the light emitting device 10 located at another point. The light emitting device 10 can emit light having a spectrum the same as or similar to the spectrum of the light with which the point at which the measurement device 30 is located is illuminated, on the basis of the light emission control information. The control unit 22 may calculate on the basis of a captured image captured by the camera 40 located at a specific point, the spectrum of light with which the point is illuminated as a spectrum measurement result. The control unit 22 obtains a spectrum measurement result regarding light with which a specific point is illuminated, and therefore, the spectrum control system 1 can reproduce light having a spectrum the same as or similar to the spectrum of light with which a certain point is illuminated at another point. It is assumed below that the spectrum of light that the spectrum control system 1 can cause the light emitting device 10 to reproduce is not limited to a spectrum the same as a spectrum identified with a spectrum measurement result and may include a similar spectrum.

Determination as to whether the spectra of two light rays have a relationship that the spectra are similar to each other may be performed on the basis of various conditions. The conditions for the spectra of two light rays to have a relationship that the spectra are similar to each other may include, for example, a condition that when the relative intensities at each wavelength are compared with each other for the spectra of the two light rays, the difference at each wavelength is within a predetermined range. The conditions for the spectra of two light rays to have a relationship that the spectra are similar to each other may include, for example, a condition that the difference between the peak wavelengths included in the spectra of the two light rays is within a predetermined range. The conditions for the spectra of two light rays to have a relationship that the spectra are similar to each other is not limited to the above-described examples and may include various conditions.

In a case where the measurement device 30 is mounted in, for example, a communication terminal or a mobile PC, when the possessor of the communication terminal or the PC travels for, for example, business or sightseeing, the measurement device 30 may measure and output as a spectrum measurement result, the spectrum of environmental light at the possessor's destination. The control unit 22 may obtain the spectrum measurement result from the measurement device 30. The control unit 22 may output light emission control information based on the obtained spectrum measurement result to the light emitting device 10 and cause the light emitting device 10 to emit the environmental light at the possessor's destination. Accordingly, the spectrum control system 1 can easily reproduce environmental light at various locations at other points.

In a case where the camera 40 is mounted in, for example, a communication terminal or a mobile PC, when the possessor of the communication terminal or the PC travels for, for example, business or sightseeing, the control unit 22 may obtain a captured image captured by the camera 40 at the possessor's destination. The control unit 22 may calculate the spectrum of light at any of the various locations on the basis of a captured image captured at the location and regard the calculated spectrum as a spectrum measurement result. The control unit 22 may output light emission control information based on the calculated spectrum measurement result to the light emitting device 10 and cause the light emitting device 10 to emit environmental light at the possessor's destination. Accordingly, the spectrum control system 1 can easily reproduce environmental light at various locations at other points.

The control unit 22 may output light emission control information to the light emitting device 10 at a timing when the control unit 22 obtains a spectrum measurement result. Accordingly, the spectrum control system 1 can reproduce light with which a certain point is illuminated at another point in real time.

The control unit 22 may store a spectrum measurement result in the storage unit 24 and output light emission control information to the light emitting device 10 at a desired timing. Accordingly, the spectrum control system 1 can reproduce light with which a certain point is illuminated at another point at any time.

In a case where the spectrum control device 20 is implemented as one of the functions of, for example, a communication terminal or a mobile PC, the control unit 22 may store in the storage unit 24, a spectrum measurement result regarding environmental light at the possessor's destination measured by the measurement device 30 mounted in the spectrum control device 20. The control unit 22 may calculate the spectrum of environmental light at the possessor's destination on the basis of a captured image captured by the camera 40 mounted in the spectrum control device 20 and store the calculated spectrum in the storage unit 24 as a spectrum measurement result. Accordingly, environmental light at a point that the possessor themselves has visited can be easily reproduced.

The control unit 22 may generate light emission control information to thereby cause the light emitting device 10 to reproduce environmental light that can be experienced in a specific region, such as sunlight in the Aegean region or sunlight in California. Accordingly, the spectrum control system 1 can make a user feel as if the user visits the specific region. The spectrum control system 1 may provide highly realistic travel experiences to, for example, persons having difficulty in going out including traveling due to, for example, a disease or a disability.

The control unit 22 may generate light emission control information to thereby cause the light emitting device 10 to reproduce environmental light that can be experienced in a specific activity, such as sunlight with which a diver is illuminated under the sea or sunlight with which a climber is illuminated on the mountain. Accordingly, the spectrum control system 1 can make experiences of various activities provided to users more realistic.

The control unit 22 may generate light emission control information to thereby cause the light emitting device 10 to reproduce various types of environmental light as lighting for, for example, a drama, a show, or a performance presented in, for example, a theater or a hall. Accordingly, the spectrum control system 1 can make, for example, the drama, the show, or the performance more realistic.

The control unit 22 may generate light emission control information to thereby cause the light emitting device 10 to reproduce various types of environmental light as lighting used in, for example, a process in which the appearance of, for example, the shade of color of an industrial product, such as an automobile, is checked. Accordingly, the spectrum control system 1 can reproduce a state where the automobile is illuminated with sunlight at various locations. In a case where automobiles are sold at various locations and if the manufacturer of the automobiles checks the appearance of, for example, the shade of color in the sunlight at various locations in order to sell the automobiles at various locations, costs for moving the automobiles to various locations are incurred. When the spectrum control system 1 reproduces sunlight at various locations, costs incurred for checking the appearance of the automobiles can be reduced. As a result, the convenience of the manufacturer of the automobiles, who is a user of the spectrum control system 1, is increased.

The control unit 22 may generate light emission control information to thereby cause the light emitting device 10 to reproduce various types of environmental light as lighting for checking the appearance of, for example, the shade of color of fashion items including clothing or accessories, or small articles. Accordingly, the spectrum control system 1 can reproduce a state where the fashion items are illuminated with sunlight at various locations. In a case where the fashion items are sold at various locations and if the manufacturer or a seller of the fashion items checks the appearance of, for example, the shade of color in the sunlight at various locations in order to sell the articles at various locations, costs for moving the articles to various locations are incurred. When the spectrum control system 1 reproduces sunlight at various locations, costs incurred for checking the appearance of the fashion items can be reduced. As a result, the convenience of the manufacturer or the seller of the fashion items, who is a user of the spectrum control system 1, is increased.

The control unit 22 may generate light emission control information to thereby cause the light emitting device 10 to reproduce various types of environmental light as lighting in, for example, a fitting room provided in a shop selling fashion items. For example, in a case of a customer who travels to various locations for, for example, business or sightseeing, the spectrum control system 1 may reproduce in a fitting room, environmental light at the customer's destination. The customer can check the appearance of, for example, the shade of color in the environmental light at the destination and decide to purchase the article.

Accordingly, the customer is less likely to feel dissatisfied with the appearance of, for example, the shade of color of the article at a location that is their travel destination. Further, the seller of the fashion items can urge the customer to purchase the article with confidence. As a result, the convenience of the customer and the seller is increased.

The spectrum control system 1 and the spectrum control device 20 according to this embodiment can create a lighting environment suitable to a user by controlling the spectrum of light to be emitted by the light emitting device 10 on the basis of a spectrum measurement result. As a result, the user's convenience is increased.

<<Flowchart>>

The spectrum control device 20 according to one embodiment may cause the control unit 22 to perform the procedure illustrated by the flowchart in FIG. 2 to thereby control the spectrum of light to be emitted by the light emitting device 10. The procedure for control to be performed by the control unit 22 may be implemented as a spectrum control program to be executed by the processor.

The control unit 22 obtains a spectrum measurement result (step S1). The control unit 22 may obtain a spectrum measurement result from the measurement device 30. The control unit 22 may calculate the spectrum of light with which a subject is illuminated on the basis of a captured image captured by the camera 40 and regard the calculated spectrum as a spectrum measurement result. The control unit 22 may store the obtained spectrum measurement result in the storage unit 24.

The control unit 22 controls the light emitting device 10 on the basis of the spectrum measurement result (step S2). The control unit 22 controls the spectrum of light to be emitted by the light emitting device 10 on the basis of the spectrum measurement result. The control unit 22 may generate and output light emission control information on the basis of the spectrum measurement result. The control unit 22 may generate and output light emission control information at a timing when the control unit 22 obtains the spectrum measurement result. The control unit 22 may generate and output light emission control information on the basis of the spectrum measurement result stored in the storage unit 24 after the elapse of a predetermined time since obtaining of the spectrum measurement result. The light emitting device 10 can obtain the light emission control information from the control unit 22 and emit light having a spectrum the same as or similar to the spectrum of measurement target light on the basis of the light emission control information. After the control unit 22 performs the procedure in step S2, the procedure illustrated by the flowchart in FIG. 2 ends.

The spectrum control device 20 according to this embodiment can control the spectrum of light to be emitted by the light emitting device 10 on the basis of a spectrum measurement result by executing the spectrum control program.

<Spectrum Control for Image Light>

The spectrum control device 20 may control the spectrum of image light of a captured image captured by the camera 40 to thereby generate a new image.

The camera 40 may capture an image of a subject in an environment in which the measurement device 30 is measuring the spectrum of light. That is, the camera 40 and the measurement device 30 may be used in the same environment. In this case, when the camera 40 captures an image of a subject, the measurement device 30 may measure the spectrum of light with which the subject is illuminated as measurement target light. In other words, the camera 40 may capture an image of a subject illuminated with measurement target light.

The camera 40 may be mounted in, for example, a communication terminal or a mobile PC together with the measurement device 30. The camera 40 may include the measurement device 30. In this case, when the camera 40 captures an image of a subject, a spectrum measurement result can be easily obtained. That is, a captured image and a spectrum measurement result can be easily obtained together. A spectrum measurement result obtained by measuring light with which a subject is illuminated as measurement target light is also called image-capture spectrum information.

The control unit 22 obtains a captured image from the camera and obtains image-capture spectrum information from the measurement device 30. The control unit 22 can generate a new image on the basis of the captured image and the image-capture spectrum information. The control unit 22 may calculate the spectrum of light with which the subject is illuminated on the basis of the captured image obtained from the camera 40. The control unit 22 may regard the spectrum calculated on the basis of the captured image as a spectrum measurement result regarding the light with which the subject is illuminated. That is, the control unit 22 may regard the spectrum calculated on the basis of the captured image as image-capture spectrum information.

For example, the control unit 22 can generate an image in which the subject is supposed to be illuminated with white light by analyzing the spectrum of image light of a captured image on the basis of image-capture spectrum information. It is assumed that white light is light having a relative intensity equal to 1 for all wavelengths in the visual light range. An image in which the subject is supposed to be illuminated with white light is also called a white-light image. The control unit 22 can generate a white-light image from a captured image on the basis of the relative intensity of measurement target light at each wavelength.

The control unit 22 can generate an image in which the subject is supposed to be illuminated with light having a specific spectrum different from the spectrum of measurement target light, on the basis of a white-light image. An image in which the subject is supposed to be illuminated with light having a specific spectrum different from the spectrum of measurement target light is also called a converted image. The control unit 22 can generate a converted image from a white-light image on the basis of the relative intensity of light, at each wavelength, having a specific spectrum.

The control unit 22 may generate a converted image from a captured image on the basis of the ratio between the relative intensity of measurement target light at each wavelength and the relative intensity of light, at each wavelength, having a specific spectrum. In this case, the control unit 22 need not generate a white-light image.

Accordingly, the control unit 22 can generate an image in which the subject appears to be illuminated with desired light. It can be said that the control unit 22 controls image light of a captured image in order to generate a white-light image or a converted image from the captured image.

The control unit 22 may, for example, generate an image that appears to be captured in a state where a subject is illuminated with sunlight outdoors, on the basis of a captured image captured under fluorescent light and a spectrum measurement result regarding the fluorescent light. The control unit 22 may, for example, generate an image of a subject that appears to be captured in fine weather, on the basis of a captured image captured in rainy or cloudy weather and a spectrum measurement result regarding measurement target light in the weather. The control unit 22 may, for example, generate an image of a subject that appears to be captured in an overseas resort, on the basis of a captured image captured at a certain point in Japan and a spectrum measurement result regarding measurement target light at the point.

The subject may be, for example, an industrial product, such as an automobile. The control unit 22 may generate images that appear to be captured in a state where an automobile is illuminated with sunlight at various locations. Accordingly, when selling the automobile at various locations, the seller of the automobile can easily tell a customer how the automobile looks in the sunlight at various locations. After actual purchase, the customer is less likely to feel dissatisfied with the appearance of, for example, the shade of color of the automobile. As a result, the convenience of both the seller and the customer is increased.

The subject may be, for example, a fashion model. The control unit 22 may generate images that appear to be captured in a state where a fashion model is illuminated with sunlight at various locations. Accordingly, a seller of clothing or an accessory worn by the fashion model or, for example, a small article carried by the fashion model can easily tell a customer how the clothing, the accessory, or the small article looks in the sunlight at various locations. When the customer actually wears the purchased clothing or accessory at various locations or actually carries the small article at various locations, the customer is less likely to feel dissatisfied with the appearance of, for example, the clothing, the accessory, or the small article. As a result, the convenience of both the seller and the customer is increased.

The spectrum control system 1 and the spectrum control device 20 according to this embodiment control the spectrum of image light on the basis of image-capture spectrum information corresponding to a spectrum measurement result regarding light with which the subject is illuminated. Accordingly, images that appear to be captured in a state where the subject is illuminated with light rays having various spectra can be generated. As a result, the user's convenience is increased.

<<Flowchart>>

The spectrum control device 20 according to one embodiment may cause the control unit 22 to perform the procedure illustrated by the flowchart in FIG. 3 to control the spectrum of image light of a captured image captured by the camera 40, thereby converting the captured image to a new image. The procedure for control to be performed by the control unit 22 may be implemented as the spectrum control program to be executed by the processor.

The control unit 22 obtains image-capture spectrum information and a captured image captured by the camera 40 (step S3). The control unit 22 may obtain a spectrum measurement result, obtained by the measurement device 30, regarding light with which the subject of the captured image is illuminated as image-capture spectrum information. The control unit 22 may calculate the spectrum of light with which the subject present in the captured image is illuminated, on the basis of the captured image captured by the camera 40 and regard the calculated spectrum as image-capture spectrum information. The control unit 22 may store the obtained image-capture spectrum information and captured image in the storage unit 24.

The control unit 22 converts the captured image on the basis of the image-capture spectrum information (step S4). The control unit 22 may generate the captured image of the subject illuminated with measurement target light, an image in which the subject appears to be illuminated with light different from the measurement target light as a new image. In this case, the control unit 22 controls the spectrum of image light of the captured image on the basis of information for identifying the spectrum of the light different from the measurement target light and the image-capture spectrum information. After the control unit 22 performs the procedure in step S4, the procedure illustrated by the flowchart in FIG. 3 ends.

The spectrum control device 20 according to this embodiment can control the spectrum of image light of a captured image on the basis of image-capture spectrum information that corresponds to a spectrum measurement result regarding light with which the subject is illuminated, by executing the spectrum control program. Accordingly, the spectrum control device 20 can generate images in which the subject appears to be illuminated with light rays having various spectra. As a result, the user's convenience is increased.

As described above, the spectrum control system 1 and the spectrum control device 20 according to one embodiment can control the spectrum of light to be emitted by the light emitting device 10 and control the spectrum of image light, on the basis of a spectrum measurement result. As a result, the user's convenience is increased.

<Measurement Environment Information>

The control unit 22 may obtain, in addition to a spectrum measurement result obtained from the measurement device 30, information for identifying a measurement environment in which the spectrum measurement result is obtained. The information for identifying the measurement environment is also called measurement environment information. The control unit 22 may obtain measurement environment information itself from the measurement device 30 or may generate measurement environment information on the basis of information obtained from the measurement device 30. The measurement environment may be identified with various types of information as described below.

The measurement environment may be identified with the time when the spectrum of measurement target light is measured. That is, the measurement environment information may include information for identifying the time when the spectrum measurement result is obtained. The time when the spectrum measurement result is obtained is also called a measurement time. The measurement time may be identified with the time or the date or may be identified with a time period represented by, for example, morning, daytime, evening, or night. The measurement time may be identified with a season represented by, for example, summer or winter. The measurement device 30 may include a clock that obtains the time when the spectrum of measurement target light is measured. The measurement device 30 may output the time when the spectrum of measurement target light is measured to the control unit 22 as measurement environment information. The control unit 22 may regard the time when the control unit 22 obtains a spectrum measurement result from the measurement device 30 as the time when the measurement device 30 measures the spectrum of measurement target light.

The measurement environment may be identified with the place where the spectrum of measurement target light is measured. That is, the measurement environment information may include information for identifying the place where the spectrum measurement result is obtained. The place where the spectrum measurement result is obtained is also called a measurement place. The measurement place may be identified with position information of the measurement device 30. The position information of the measurement device 30 may include information regarding the latitude or longitude, or the altitude. The measurement device 30 may obtain position information thereof on the basis of, for example, a GNSS (Global Navigation Satellite System) technique. The GNSS technique may include a satellite positioning system, such as GPS (Global Positioning System), GLONASS, Galileo, or Quasi-Zenith Satellite System (QZSS). The measurement device 30 may output position information thereof to the control unit 22 as measurement environment information.

The control unit 22 may determine whether the measurement place is located outdoors or located indoors on the basis of position information of the measurement device 30. That is, the measurement environment information may include information for determining whether the measurement place is located outdoors or located indoors. In a case where the measurement place is located outdoors, measurement target light may be regarded as sunlight. In a case where a measurement place is located indoors, measurement target light may be regarded as illumination light emitted from a lighting device, such as an incandescent lightbulb, a fluorescent lamp, or an LED (light emitting diode) lamp.

In a case where sunlight is measured as measurement target light, the spectrum of the sunlight can be determined on the basis of the altitude of the sun. Therefore, the measurement environment may be identified on the basis of the altitude of the sun. The altitude of the sun is determined on the basis of the latitude. The altitude of the sun is determined further on the basis of the time. That is, information regarding the latitude or information regarding the time can have a correlation with a spectrum measurement result obtained in the case where sunlight is measured as measurement target light.

The relation between the spectrum of sunlight and the altitude of the sun can be described as below. Sunlight is scattered by the atmosphere until the sunlight reaches the surface of the earth. The distance of the atmospheric layer over which sunlight passes until the sunlight reaches a measurement environment is longer in a case where the sun is located close to the horizon when viewed from the measurement environment than in a case where the sun is located close to the zenith. That is, as the altitude of the sun when viewed from a measurement environment is lower, the distance of the atmospheric layer over which sunlight passes until the sunlight reaches the measurement environment is longer. In the spectrum of sunlight, for example, a blue component having a short wavelength is more likely to be scattered in the atmosphere than, for example, a red component having a long wavelength. That is, as the distance of the atmospheric side over which sunlight passes is longer, for example, a blue component having a short wavelength is less likely to reach a measurement environment because of scattering in the atmosphere than, for example, a red component having a long wavelength. For example, as the altitude of the sun when viewed from a measurement environment is lower, in the spectrum of sunlight, the ratio of, for example a red component having a long wavelength to, for example, a blue component having a short wavelength can increase.

The control unit 22 may determine whether the measurement place is located in a mountainous area or located in a coastal area on the basis of position information of the measurement device 30. The control unit 22 may determine whether the measurement place is located in an urban area or located in a rural area on the basis of position information of the measurement device 30. The control unit 22 may determine whether the measurement place is located in, for example, a desert area, a steppe area, or a lacustrine area on the basis of position information of the measurement device 30. That is, the measurement environment information may include information indicating geographical features of the measurement place. Measurement target light can include not only sunlight but also reflected light from the surface of the earth. Therefore, the information indicating geographical features of the measurement place can have a correlation with the spectrum measurement result.

The control unit 22 may identify the name of a place, such as the name of a city, ward, town, or village or the name of a prefecture, where the measurement place is located on the basis of position information of the measurement device 30. The control unit 22 may identify the name of a country, such as Japan, where the measurement place is located or may identify the name of a region, such as Asia, Europe, Africa, North America, South America, or Oceania, where the measurement place is located on the basis of position information of the measurement device 30. That is, the measurement environment information may include information for identifying the name of a place, the name of a country, or the name of a region where the measurement place is located.

The control unit 22 may identify information regarding the measurement place on the basis of map information and position information of the measurement device 30.

The measurement environment may be identified with the weather when the spectrum of measurement target light is measured. That is, the measurement environment information may include information for identifying the weather when the spectrum measurement result is obtained. As described above, sunlight is scattered in the atmosphere. Sunlight that is measurement target light can include not only direct sunlight from the sun but also light scattered in the whole sky. The weather represents the state of the atmosphere and can affect the spectrum of sunlight that reaches the surface of the earth. The weather may be identified as, for example, fine, cloudy, or rainy or snowy weather. The weather may be identified on the basis of whether the sun is hidden by clouds. The weather may be identified on the basis of the cloud cover indicating the ratio of clouds to the whole sky. The control unit 22 may obtain information for identifying the weather at the time and the position at which the spectrum measurement result is obtained, from a database regarding weather information provided by, for example, the Meteorological Agency or a private weather service provider.

The measurement device 30 may include an input unit that accepts input of information from an operator of the measurement device 30. The input unit may include an input device, such as a touch panel, a keyboard, or a mouse. The operator of the measurement device 30 may input, for example, information regarding the time or the position at which the spectrum measurement result is obtained or information regarding the weather at the time when the spectrum measurement result is obtained. The measurement device 30 may output the information input by the operator as the measurement environment information.

<Spectrum Database>

The control unit 22 generates spectrum data 110 (see FIG. 4) that includes a spectrum measurement result and measurement environment information corresponding to the spectrum measurement result. With the spectrum data 110, a correspondence between the spectrum measurement result and the measurement environment information is identified. The control unit 22 may store the spectrum data 110 in the storage unit 24. The control unit 22 may store a plurality of pieces of spectrum data 110 in the storage unit 24 as a spectrum database 100 (see FIG. 4). The spectrum database 100 is managed with a data structure that includes a spectrum measurement result and measurement environment information corresponding to the spectrum measurement result as data elements. That is, each piece of spectrum data 110 that forms the spectrum database 100 has a data structure that includes a spectrum measurement result and measurement environment information corresponding to the spectrum measurement result as data elements.

The spectrum control system 1 according to one embodiment may generate the spectrum database 100 having a data structure illustrated in FIG. 4. The spectrum database 100 may include a plurality of pieces of spectrum data 110. Each piece of spectrum data 110 includes a spectrum measurement result and measurement environment information corresponding to the spectrum measurement result. Spectrum measurement results are expressed as $S\_1$ to $S\_N$ (N: natural number). Each spectrum measurement result includes the relative intensity of measurement target light at each wavelength in the visible light range. Each spectrum measurement result may include the relative intensity at a wavelength outside the visible light range. It is assumed that the measurement environment information includes a measurement date for identifying the year, month, and day when the spectrum is measured, a measurement time for identifying the time when the spectrum is measured, a measurement position for identifying the position where the spectrum is measured with the longitude and the latitude, and the weather when the spectrum is measured. The measurement environment information may include some of the pieces of information illustrated above or may include other information. In each piece of spectrum data 110, a spectrum measurement result and measurement environment information corresponding to the spectrum measurement result are associated with each other on a one-to-one basis. The spectrum database 100 may include a plurality of pieces of spectrum data 110 in the form of table.

The control unit 22 can extract a piece of spectrum data 110 from the spectrum database 100 on the basis of information that is at least one of a spectrum measurement result or measurement environment information. That is, when searching the spectrum database 100 while using information that is at least one of a spectrum measurement result or measurement environment information as an index, the control unit 22 can identify the other information corresponding to the information used as the index. In a case of searching the spectrum database 100 while using measurement environment information as an index, the control unit 22 may use one or more pieces of information included in the measurement environment information as indices. The control unit 22 may search the spectrum database 100 while using, for example, a measurement position and a measurement time as indices. The control unit 22 may search the spectrum database 100 while using, for example, information indicating geographical features of a measurement place as an index.

The control unit 22 may obtain information for identifying an index for searching the spectrum database 100 by input from a user. The spectrum control device 20 may include an input unit for accepting input of information from the user. The input unit may include an input device, such as a touch panel, a keyboard or a mouse. The input unit may be included in the interface 26. The control unit 22 may obtain information for identifying an index on the basis of information input to the input unit by the user.

The control unit 22 may extract a piece of spectrum data 110 including information that matches an index or may extract a piece of spectrum data 110 including information similar to an index. In a case where, for example, a measurement position is used as an index, the control unit 22 may extract a piece of spectrum data 110 associated with position information that matches position information specified as the index. The control unit 22 may extract a piece of spectrum data 110 associated with position information for identifying a position that is within a predetermined distance from a position identified with position information specified as the index. The control unit 22 may extract a piece of spectrum data 110 while using, for example, information indicating that the measurement place is a coast, which is information indicating geographical features of the measurement place, as an index. In this case, the control unit 22 can extract a piece of spectrum data 110 including a spectrum measurement result obtained at the coast. The control unit 22 may extract a piece of spectrum data 110 while using various types of information in addition to the above-described examples as indices.

The spectrum control system 1 and the spectrum control device 20 according to this embodiment can manage pieces of spectrum data 110 by generating the spectrum database 100. When the spectrum database 100 is searched while measurement environment information is used as an index, a spectrum measurement result can be easily extracted. When the spectrum database 100 is searched on the basis of input from a user, the user's convenience is increased.

When a new piece of spectrum data 110 is added to the spectrum database 100, more information can be searched for in the spectrum database 100. The control unit 22 may unconditionally add a new piece of spectrum data 110 to the spectrum database 100.

The control unit 22 may determine whether to add a new piece of spectrum data 110 to the spectrum database 100 by comparing the new piece of spectrum data 110 with pieces of spectrum data 110 already included in the spectrum database 100. A piece of spectrum data 110 already included in the spectrum database 100 is also called an existing piece of data. A new piece of spectrum data 110 is also called a new piece of data.

To determine whether to add a new piece of data, the control unit 22 may search for existing pieces of data while using at least a portion of measurement environment information included in the new piece of data as an index and extract an existing piece of data associated with information the same as or similar to the index. The control unit 22 may, for example, extract an existing piece of data obtained at a date and time within a predetermined time period from the measurement date and the measurement time included in the new piece of data and obtained at a position within a predetermined distance from the measurement position included in the new piece of data.

In a case where the difference between the spectrum measurement result included in the new piece of data and the spectrum measurement result included in the extracted existing piece of data is within a predetermined range, the control unit 22 may decide to add the new piece of data to the spectrum database 100. In a case where the difference between the spectrum measurement result included in the new piece of data and the spectrum measurement result included in the extracted existing piece of data is outside the predetermined range, the control unit 22 may decide not to add the new piece of data to the spectrum database 100.

When the control unit 22 determines whether to add a new piece of data, an unsuitable piece of data is less likely to be added to the spectrum database 100. As the number of unsuitable pieces of data included in the spectrum database 100 decreases, the reliability of a spectrum measurement result extracted by a search increases, and the degree of reproduction of environmental light based on the extracted spectrum measurement result becomes higher. As a result, the spectrum database 100 becomes more useful.

<<Flowchart>>

Figure 5:
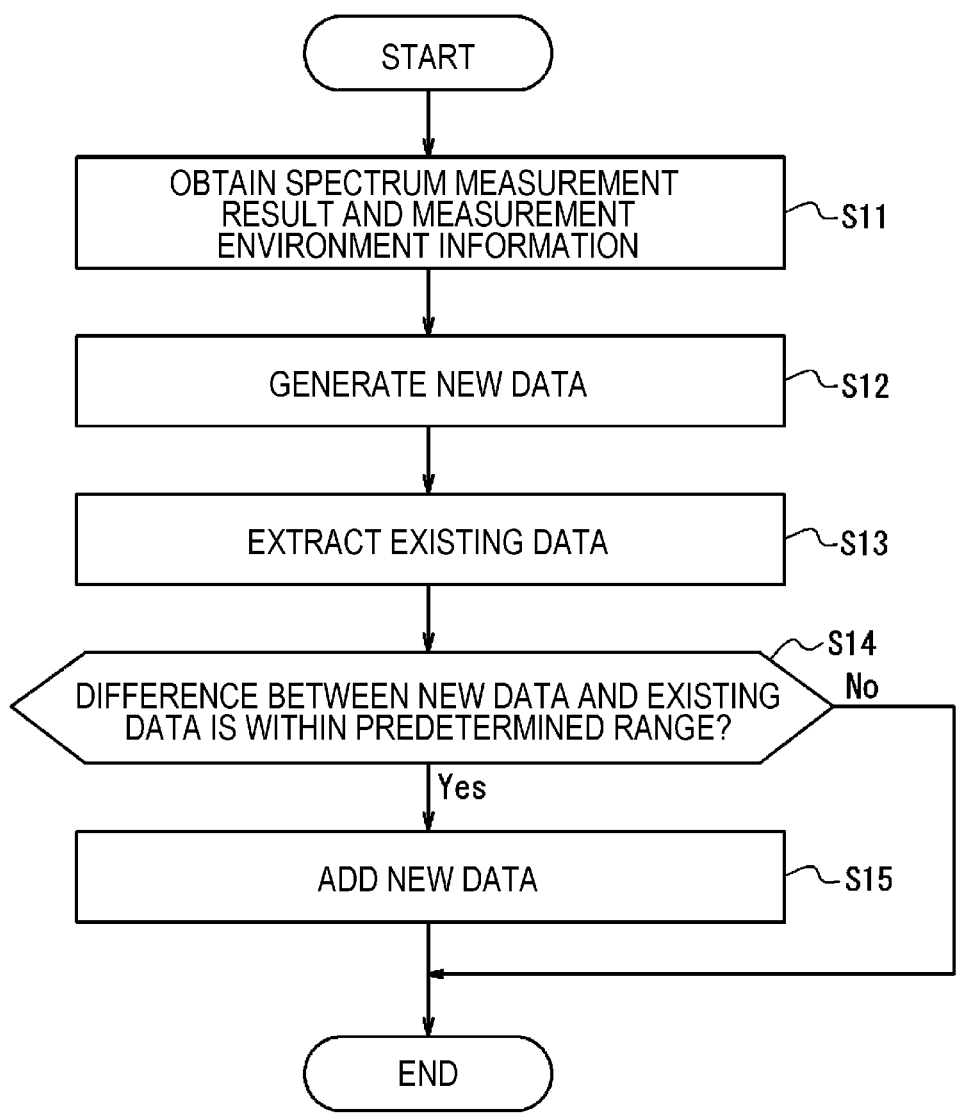
FIG. 5 is a flowchart illustrating an example procedure for generating a spectrum database.

The spectrum control device 20 according to one embodiment may cause the control unit 22 to perform the procedure illustrated by the flowchart in FIG. 5 to thereby generate the spectrum database 100. The procedure for control to be performed by the control unit 22 may be implemented as the spectrum control program to be executed by the processor.

The control unit 22 obtains a spectrum measurement result and measurement environment information for identifying an environment in which the spectrum measurement result is obtained (step S11).

The control unit 22 generates a new piece of spectrum data 110 in which the spectrum measurement result and the measurement environment information are associated with each other, as a new piece of data (step S12).

The control unit 22 searches the spectrum database 100 while using at least a portion of the measurement environment information included in the new piece of data as an index and extracts an existing piece of data associated with information the same as or similar to the index (step S13).

The control unit 22 compares the spectrum measurement result in the new piece of data with a spectrum measurement result included in the extracted existing piece of data and determines whether the difference between the spectrum measurement results is within a predetermined range (step S14). If the control unit 22 determines that the difference between the spectrum measurement results is not within the predetermined range (NO in step S14), the procedure illustrated by the flowchart in FIG. 5 ends.

If the control unit 22 determines that the difference is within the predetermined range (YES in step S14), the control unit 22 adds the new piece of data to the spectrum database 100 (step S15). After the control unit 22 performs the procedure in step S15, the procedure illustrated by the flowchart in FIG. 5 ends.

The spectrum control device 20 according to this embodiment can generate the spectrum database 100 by executing the spectrum control program. With the spectrum database 100, pieces of spectrum data 110 can be easily managed. The spectrum database 100 allows, for example, a search of the spectrum database 100 using measurement environment information as an index. Accordingly, a spectrum measurement result can be easily extracted. The spectrum database 100 allows a search of the spectrum database 100 based on input from a user. Accordingly, the user's convenience is increased.

The spectrum control device 20 can determine whether to add a new piece of data by executing the spectrum control program. Accordingly, the spectrum database 100 becomes more useful.

<<Complement to Spectrum Database>>

The spectrum database 100 might not include a piece of spectrum data 110 associated with information that matches or is similar to an index used by the control unit 22 in a search. In this case, the control unit 22 may generate a piece of spectrum data 110 associated with information that matches or is similar to the index on the basis of another piece of spectrum data 110. The control unit 22 may use the generated piece of spectrum data 110 as a search result. That is, the control unit 22 may complement a piece of spectrum data 110 not included in the spectrum database 100. Accordingly, the spectrum database 100 becomes more useful.

For example, it is supposed that the control unit 22 searches the spectrum database 100 for a spectrum measurement result that is obtained at a point called a first point at a first time. It is supposed that the spectrum database 100 does not include a spectrum measurement result obtained at the first point at the first time or at a time within a predetermined time period from the first time but includes a spectrum measurement result obtained at a second time different from the first time by the predetermined time period or more. In this case, the control unit 22 may generate a spectrum measurement result that is expected to be obtained at the first point at the first time on the basis of the spectrum measurement result obtained at the first point at the second time. The control unit 22 may use a plurality of spectrum measurement results obtained at the second time.

For example, it is supposed that the control unit 22 searches the spectrum database 100 for a spectrum measurement result obtained at the first point in spring. It is supposed that the spectrum database 100 does not include a spectrum measurement result obtained at the first point in spring but includes spectrum measurement results obtained at the first point in summer and in winter. In this case, the control unit 22 may generate a spectrum measurement result that is expected to be obtained at the first point in spring on the basis of the spectrum measurement results obtained at the first point in summer and in winter.

For example, it is supposed that the control unit 22 searches the spectrum database 100 for a spectrum measurement result obtained at the first point at the first time. It is supposed that the spectrum database 100 does not include a spectrum measurement result obtained at the first point or a point that is within a predetermined range from the first point at the first time but includes a spectrum measurement result obtained at a second point outside the predetermined range from the first point at the first time. In this case, the control unit 22 may generate a spectrum measurement result that is expected to be obtained at the first point at the first time on the basis of the spectrum measurement result obtained at the second point at the first time. The control unit 22 may use a plurality of spectrum measurement results obtained at the second point.

<Reproduction of Environment based on Spectrum Data>

The spectrum control system 1 can reproduce on the basis of information for identifying an environment that a user wants to reproduce, the spectrum of light with which the environment is illuminated. The environment that a user wants to reproduce is also called a reproduced environment. Information for identifying a reproduced environment is also called reproduced-environment information. The control unit 22 may obtain reproduced-environment information on the basis of information input to the input unit by the user. The control unit 22 may obtain reproduced-environment information from another device.

The control unit 22 searches the spectrum database 100 on the basis of reproduced-environment information and extracts a piece of spectrum data 110 associated with measurement environment information the same as or similar to the reproduced-environment information. The extracted piece of spectrum data 110 can include a spectrum measurement result with which a spectrum the same as or similar to the spectrum of light in the reproduced environment is identified. The spectrum measurement result with which a spectrum the same as or similar to the spectrum of light in the reproduced environment is identified is also called spectrum reproduction information.

Spectrum reproduction information may include information for identifying the spectrum of environmental light that can be experienced in a specific region, such as sunlight in the Aegean region or sunlight in California. Spectrum reproduction information may include information for identifying the spectrum of environmental light that can be experienced in a specific activity, such as sunlight with which a diver is illuminated under the sea or sunlight with which a climber is illuminated on the mountain. Spectrum reproduction information may include information for identifying the spectra of sunlight in various types of weather. Spectrum reproduction information may include information for identifying the spectra of environmental light at various locations used as, for example, lighting in a process in which the appearance of, for example, the shade of color of an industrial product, such as an automobile, is checked. Spectrum reproduction information may include information for identifying the spectra of various types of environmental light used as lighting in, for example, a fitting room.

<<Spectrum Control for Light Emitting Device>>

The spectrum control system 1 can cause the light emitting device 10 to reproduce light in a reproduced environment on the basis of spectrum reproduction information included in an extracted piece of spectrum data 110. The control unit 22 generates control information for causing the light emitting device 10 to emit light in the reproduced environment on the basis of the spectrum reproduction information and outputs the control information to the light emitting device 10. Accordingly, the spectrum control system 1 can cause the light emitting device 10 to easily reproduce light in the reproduced environment. As a result, the user's convenience is increased.

<<Spectrum Control for Captured Image>>

The spectrum control system 1 can generate an image in which the subject appears to be illuminated with light in a reproduced environment, on the basis of spectrum reproduction information and image-capture spectrum information for identifying the spectrum of light in an environment in which a captured image is captured. Accordingly, the spectrum control system 1 can reproduce images captured in various environments from one captured image. As a result, the user's convenience is increased.

<<Flowchart>>

Figure 6:
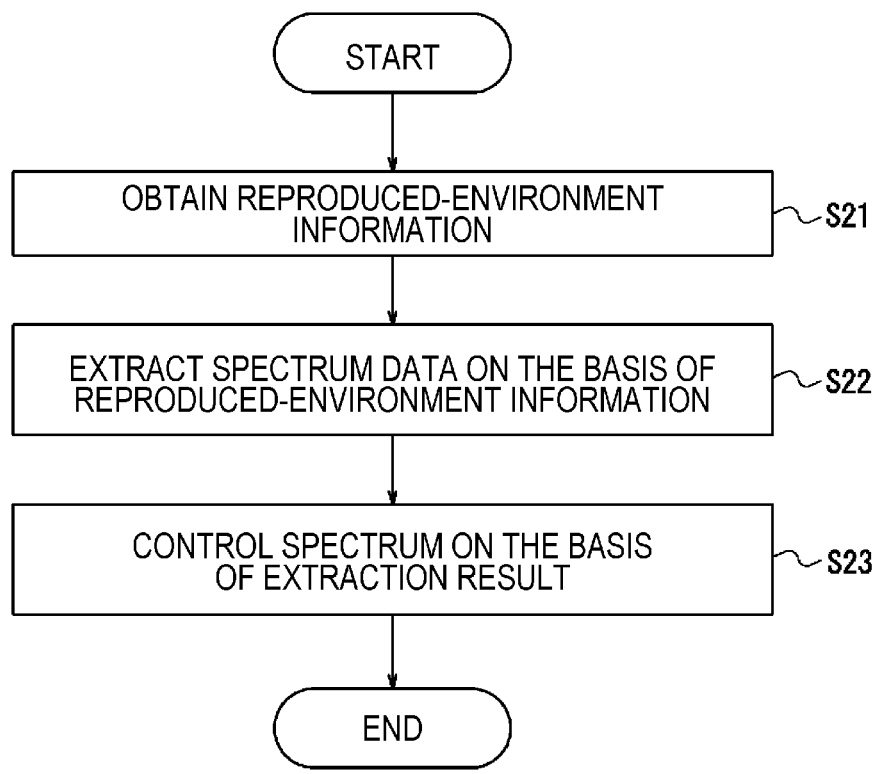
FIG. 6 is a flowchart illustrating an example procedure for controlling a spectrum on the basis of reproduced-environment information.

The spectrum control device 20 according to one embodiment may cause the control unit 22 to perform the procedure illustrated by the flowchart in FIG. 6 to thereby control a spectrum on the basis of reproduced-environment information. The procedure for control to be performed by the control unit 22 may be implemented as the spectrum control program to be executed by the processor.

The control unit 22 obtains reproduced-environment information (step S21). The control unit 22 may obtain reproduced-environment information on the basis of information input by a user or may obtain reproduced-environment information from another device.

The control unit 22 extracts a piece of spectrum data 110 on the basis of the reproduced-environment information (step S22). The control unit 22 may search the spectrum database 100 while using at least a portion of the reproduced-environment information as an index. The control unit 22 extracts a piece of spectrum data 110 associated with measurement environment information that includes information the same as or similar to the information used as the index. A spectrum measurement result associated with the extracted piece of spectrum data 110 can be spectrum reproduction information.

The control unit 22 controls the spectrum of light on the basis of the result of extraction in step S22 (step S23). The result of extraction can include spectrum reproduction information.

The control unit 22 may control the light emitting device 10 on the basis of the spectrum reproduction information that is the result of extraction. The control unit 22 may generate and output to the light emitting device 10, control information for controlling the spectrum of light to be emitted by the light emitting device 10. Accordingly, the spectrum control system 1 can cause the light emitting device 10 to emit light in the reproduced environment.

The control unit 22 may obtain a captured image captured by the camera 40 and image-capture spectrum information and control image light of the captured image on the basis of the image-capture spectrum information and the spectrum reproduction information that is the result of extraction. Accordingly, the spectrum control system 1 can generate an image in which the subject appears to be illuminated with light in the reproduced environment.

After the control unit 22 performs the procedure in step S23, the procedure illustrated by the flowchart in FIG. 6 ends.

The spectrum control device 20 according to this embodiment can control the spectrum of light to be emitted by the light emitting device 10 on the basis of reproduced-environment information, by executing the spectrum control program. Accordingly, light in the reproduced environment can be reproduced by the light emitting device 10. The spectrum control device 20 can control the spectrum of image light of a captured image by executing the spectrum control program. Accordingly, an image in which the subject appears to be illuminated with light in the reproduced environment can be generated. As a result, the user's convenience is increased.

Example Configuration of Light Emitting Device

Figure 7:
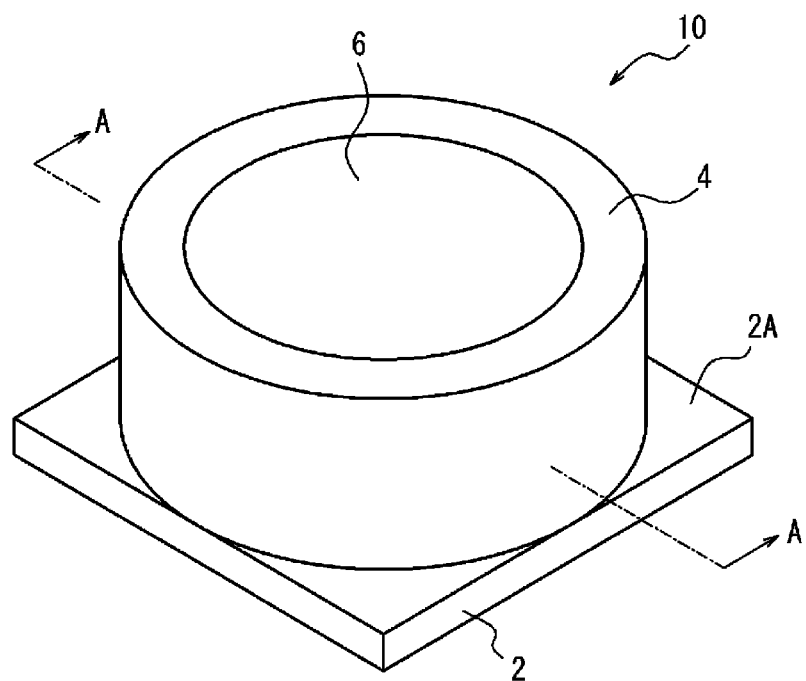
FIG. 7 is an external perspective view illustrating an example configuration of the light emitting device.
Figure 8:
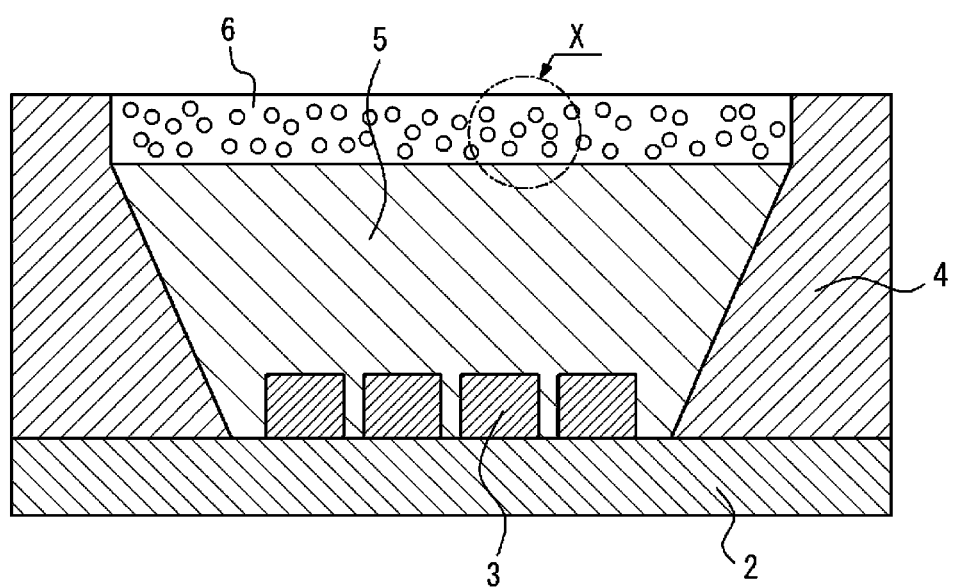
FIG. 8 is a cross-sectional view cut along A-A in FIG. 7.
Figure 9:
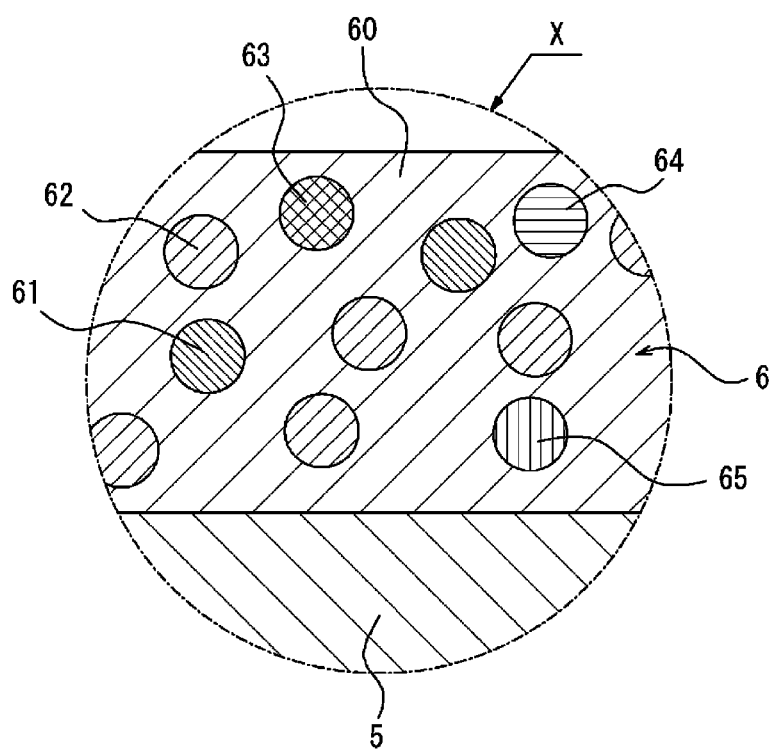
FIG. 9 is an enlarged view of a circled part in FIG. 8.

As illustrated in FIG. 7, FIG. 8, and FIG. 9, the light emitting device 10 includes a light emitting element 3 and a wavelength conversion member 6. The light emitting device 10 may further include an element substrate 2, a frame body 4, and a sealing member 5.

Figure 10:
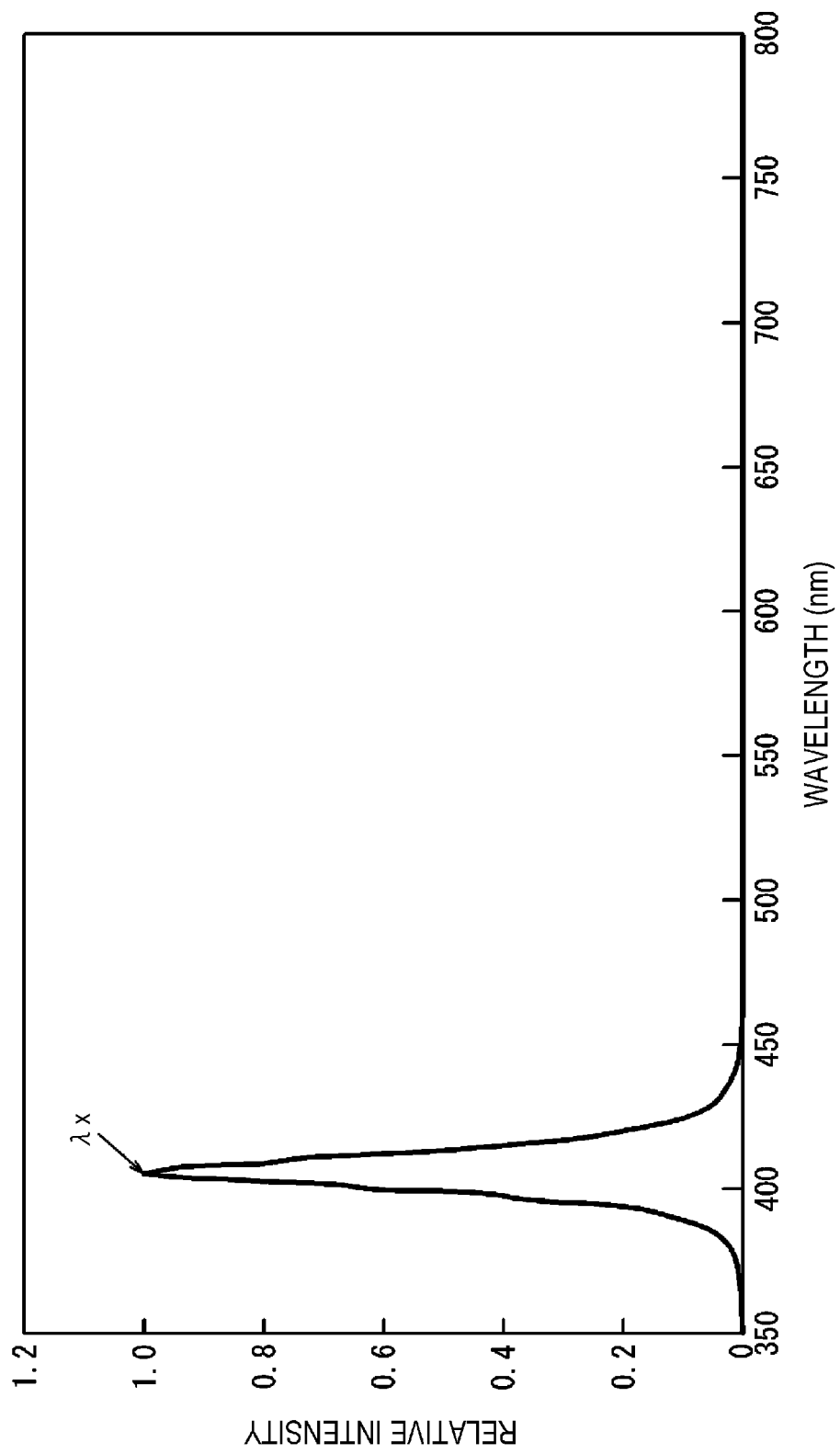
FIG. 10 is a graph showing a spectrum of near-ultraviolet light.

The light emitting element 3 emits light having a peak wavelength in a wavelength range of 360 nm to 430 nm. The light emitting element 3 can emit, for example, light having a spectrum shown as the graph in FIG. 10. In the graph in FIG. 10, the horizontal axis and the vertical axis respectively represent the wavelength and the relative intensity of light emitted by the light emitting element 3. The relative intensity is expressed as the ratio of an intensity to the intensity at the peak wavelength. According to the graph in FIG. 10, the light emitting element 3 emits light having a wavelength indicated by Xx as its peak wavelength. The wavelength indicated by Xx is included in a wavelength range of 360 nm to 430 nm. That is, the light emitting element 3 emits light having a peak wavelength in a wavelength range of 360 nm to 430 nm. Light having a peak wavelength in a wavelength range of 360 nm to 430 nm is also called near-ultraviolet light. A wavelength range of 360 nm to 430 nm is also called a near-ultraviolet light range.

The wavelength conversion member 6 converts light coming into the wavelength conversion member 6 from the light emitting element 3 to light having a peak wavelength in the visible light range and emits the converted light. It is assumed that visible light includes near-ultraviolet light. It is assumed that the visible light range includes the near-ultraviolet light range.

The light emitting device 10 may have a plurality of wavelength conversion members 6. The plurality of wavelength conversion members 6 may emit light rays having different peak wavelengths respectively. The light emitting device 10 can emit light rays having various spectra by controlling the intensity of a light ray emitted by each wavelength conversion member 6. The light emitting device 10 can emit light having, for example, the spectrum of direct sunlight from the sun, the spectrum of sunlight that reaches a predetermined depth under the sea, the spectrum of candle light, or the spectrum of a firefly flash.

The element substrate 2 may be formed of, for example, an insulating material. The element substrate 2 may be formed of, for example, a ceramic material, such as alumina or mullite, a glass ceramic material, or a composite material obtained by mixing a plurality of materials among the above-described materials. The element substrate 2 may be formed of, for example, a polymeric resin material in which metal-oxide particles for which thermal expansion can be adjusted are dispersed.

The element substrate 2 may include, on a main surface 2A of the element substrate 2 or inside the element substrate 2, a wiring conductor that allows electrical conduction of components including the light emitting element 3 mounted on the element substrate 2. The wiring conductor may be formed of, for example, a conductive material, such as tungsten, molybdenum, manganese, or copper. The wiring conductor may be formed by printing, on ceramic green sheets that form the element substrate 2, a predetermined pattern with metal paste made of tungsten powder to which an organic solvent is added and by stacking and firing the plurality of ceramic green sheets. On the surface of the wiring conductor, for example, a plated layer made of, for example, nickel or gold may be formed to prevent oxidation.

The element substrate 2 may include a metal reflection layer spaced apart from the wiring conductor and the plated layer to efficiently release light emitted by the light emitting element 3 to the outside. The metal reflection layer may be formed of, for example, a metal material made of, for example, aluminum, silver, gold, copper, or platinum.

This embodiment assumes that the light emitting element 3 is an LED. An LED has a PN junction at which a P-type semiconductor and an N-type semiconductor join and at which electrons and positive holes are recoupled to thereby externally emit light. The light emitting element 3 is not limited to an LED and may be another type of light emitting element.

The light emitting element 3 is mounted on the main surface 2A of the element substrate 2. The light emitting element 3 may be electrically connected onto the plated layer that adheres to the surface of the wiring conductor provided on or in the element substrate 2 via, for example, a brazing material or solder. The number of light emitting elements 3 mounted on the main surface 2A of the element substrate 2 is not specifically limited.

The light emitting element 3 may include a translucent base substrate and an optical semiconductor layer formed on the translucent base substrate. The translucent base substrate includes, for example, a material that allows deposition of the optical semiconductor layer thereon using chemical vapor deposition, such as metal-organic chemical vapor deposition or molecular beam epitaxial deposition. The translucent base substrate may be made of, for example, sapphire, gallium nitride, aluminum nitride, zinc oxide, zinc selenide, silicon carbide, silicon, or zirconium diboride. The thickness of the translucent base substrate may be, for example, 50 μm or more and 1000 μm or less.

The optical semiconductor layer may include a first semiconductor layer formed on the translucent base substrate, a light emitting layer formed on the first semiconductor layer, and a second semiconductor layer formed on the light emitting layer. The first semiconductor layer, the light emitting layer, and the second semiconductor layer may be formed of, for example, a III-nitride semiconductor, a III-V semiconductor such as gallium phosphide or gallium arsenide, or a III-nitride semiconductor such as gallium nitride, aluminum nitride, or indium nitride.

The thickness of the first semiconductor layer may be, for example, 1 μm or more and 5 μm or less. The thickness of the light emitting layer may be, for example, 25 nm or more and 150 nm or less. The thickness of the second semiconductor layer may be, for example, 50 nm or more and 600 nm or less.

The frame body 4 may be formed of, for example, a ceramic material, such as aluminum oxide, titanium oxide, zirconium oxide, or yttrium oxide. The frame body 4 may be formed of a porous material. The frame body 4 may be formed of a resin material into which powder that contains a metal oxide, such as aluminum oxide, titanium oxide, zirconium oxide, or yttrium oxide, is mixed. The frame body 4 need not be formed of the above-described materials and may be formed of various materials.

The frame body 4 is connected to the main surface 2A of the element substrate 2 via, for example, a resin, a brazing material, or solder. The frame body 4 is provided on the main surface 2A of the element substrate 2 so as to be spaced apart from the light emitting element 3 and surround the light emitting element 3. The frame body 4 is provided such that its inner wall surface is gradually inclined so as to extend outward as its part is farther from the main surface 2A of the element substrate 2. The inner wall surface functions as a reflection surface that reflects light emitted by the light emitting element 3. The inner wall surface may include, for example, a metal layer formed of a metal material, such as tungsten, molybdenum, or manganese, and a plated layer that covers the metal layer and is formed of a metal material, such as nickel or gold. The plated layer reflects light emitted by the light emitting element 3.

The shape of the inner wall surface of the frame body 4 may be a round shape in plan view. When the shape of the inner wall surface is a round shape, the frame body 4 can substantially uniformly reflect light emitted by the light emitting element 3 outward. The angle of inclination of the inner wall surface of the frame body 4 may be set to, for example, an angle of 55 degrees or more and 70 degrees or less relative to the main surface 2A of the element substrate 2.

The inner space surrounded by the element substrate 2 and the frame body 4 is filled with the sealing member 5 except a part of the upper part of the inner space surrounded by the frame body 4. The sealing member 5 seals the light emitting element 3 and allows light emitted by the light emitting element 3 to pass therethrough. The sealing member 5 may be formed of, for example, a material having optical transparency. The sealing member 5 may be formed of, for example, an insulating resin material having optical transparency, such as a silicone resin, an acrylic resin, or an epoxy resin, or a glass material having optical transparency. The refractive index of the sealing member 5 may be set to, for example, 1.4 or more and 1.6 or less.

In a case where the light emitting device 10 includes the sealing member 5, near-ultraviolet light emitted from the light emitting element 3 passes through the sealing member 5 and enters the wavelength conversion member 6. As described above, the wavelength conversion member 6 converts the near-ultraviolet light coming thereinto from the light emitting element 3 to light rays having various peak wavelengths included in the visible light range. The light emitting element 3 is located such that the emitted near-ultraviolet light enters the wavelength conversion member 6. In other words, the wavelength conversion member 6 is located such that light emitted from the light emitting element 3 enters the wavelength conversion member 6. In the structure illustrated in FIG. 7 to FIG. 9, the wavelength conversion member 6 is located in the part of the upper part of the inner space surrounded by the element substrate 2 and the frame body 4 along the upper surface of the sealing member 5. The wavelength conversion member 6 need not be located as in the example described above and may be located so as to, for example, extend out of the upper part of the inner space surrounded by the element substrate 2 and the frame body 4.

As illustrated in FIG. 9, the wavelength conversion member 6 may include a translucent member 60 having optical transparency, a first fluorescent substance 61, a second fluorescent substance 62, a third fluorescent substance 63, a fourth fluorescent substance 64, and a fifth fluorescent substance 65. The first fluorescent substance 61, the second fluorescent substance 62, the third fluorescent substance 63, the fourth fluorescent substance 64, and the fifth fluorescent substance 65 are also simply called fluorescent substances. It is assumed that the fluorescent substances are contained in the translucent member 60. The fluorescent substances may be substantially uniformly dispersed in the translucent member 60. The fluorescent substances convert near-ultraviolet light entering the wavelength conversion member 6 to light rays having peak wavelengths included in a wavelength range of 360 nm to 780 nm and emits the converted light rays.

The translucent member 60 may be formed of, for example, an insulating resin having optical transparency, such as a fluorine resin, a silicone resin, an acrylic resin, or an epoxy resin, or a glass material having optical transparency.

The fluorescent substances convert incoming near-ultraviolet light to light rays having various peak wavelengths. In the graphs in FIG. 11 and FIG. 12, example fluorescence spectra of the fluorescent substances are shown. In the graphs in FIG. 11 and FIG. 12, the horizontal axis and the vertical axis respectively represent the wavelength and the relative intensity of light emitted by each fluorescent substance.

Figure 11:
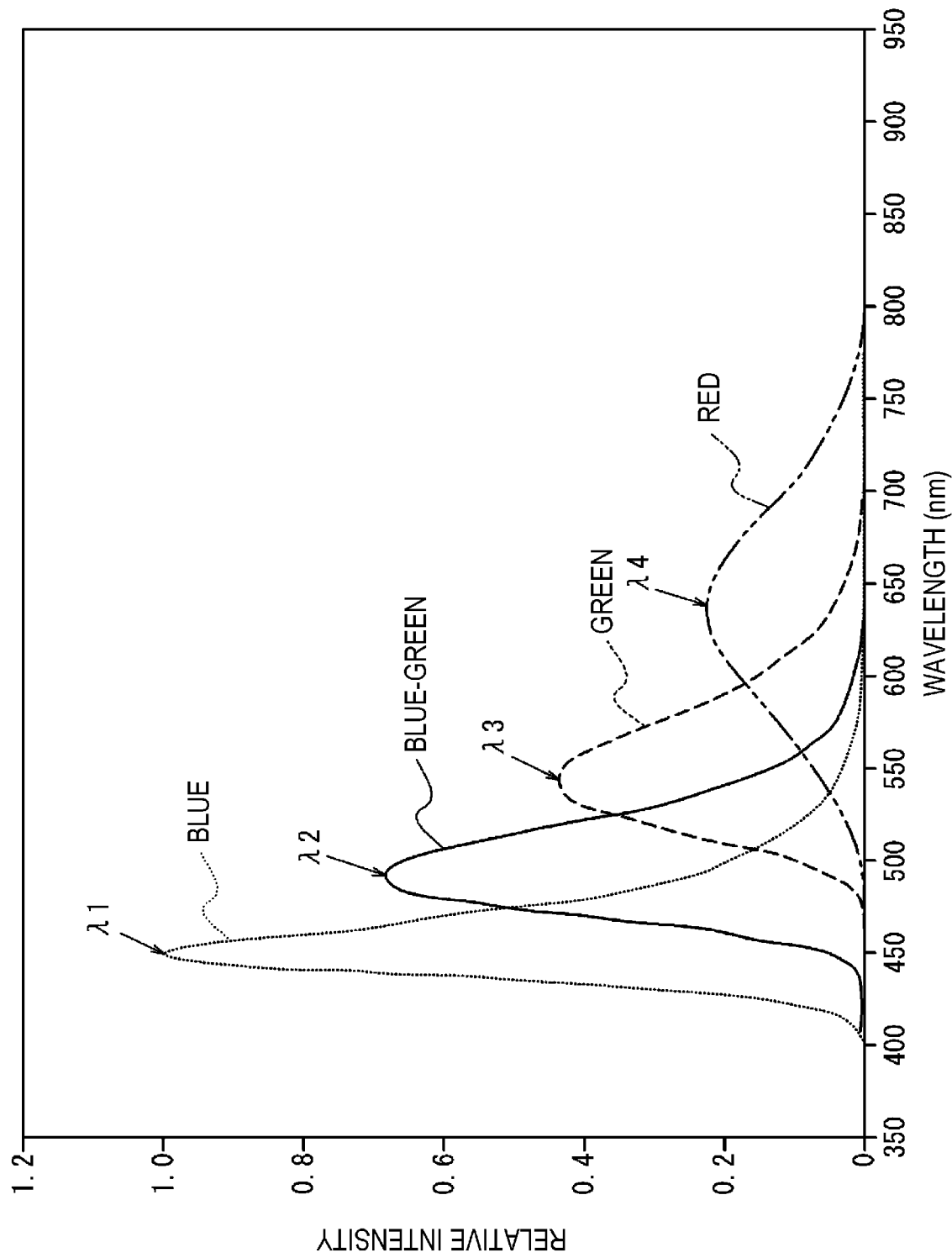
FIG. 11 is a graph showing spectra of blue fluorescence, blue-green fluorescence, green fluorescence, and red fluorescence.

The first fluorescent substance 61 may have a first peak wavelength indicated by $\lambda 1$ in the graph in FIG. 11. It is assumed that the first peak wavelength is a wavelength within a wavelength range of 400 nm to 500 nm. The first fluorescent substance 61 emits, for example, blue light. As the first fluorescent substance 61, for example, $BaMgAl_{10}O_{17}:Eu$, or $(Sr,Ca,Ba)_{10}(PO_4)_6Cl_2:Eu$, $(Sr,Ba)_{10}(PO_4)_6Cl_2:Eu$ can be used.

The second fluorescent substance 62 may have a second peak wavelength indicated by $\lambda 2$ in the graph in FIG. 11. It is assumed that the second peak wavelength is a wavelength within a wavelength range of 450 nm to 550 nm. The second fluorescent substance 62 emits, for example, blue-green light. As the second fluorescent substance 62, for example, $(Sr,Ba,Ca)_5(PO_4)_3Cl:Eu$, $Sr_4Al_{14}O_{25}:Eu$ can be used.

The third fluorescent substance 63 may have a third peak wavelength indicated by λ3 in the graph in FIG. 11. It is assumed that the third peak wavelength is a wavelength within a wavelength range of 500 nm to 600 nm. The third fluorescent substance 63 emits, for example, green light. As the third fluorescent substance 63, for example, $SrSi_2(O,Cl)_2 N_2$:Eu, $(Sr,Ba,Mg)_2 SiO_4$:$Eu^{2+}$, or ZnS:Cu,Al, $Zn_2SiO_4$:Mn can be used.

The fourth fluorescent substance 64 may have a fourth peak wavelength indicated by λ4 in the graph in FIG. 11. It is assumed that the fourth peak wavelength is a wavelength within a wavelength range of 600 nm to 700 nm. The fourth fluorescent substance 64 emits, for example, red light. As the fourth fluorescent substance 64, for example, $Y_2O_2S$:Eu, $Y_2O_3$:Eu, $SrCaClAlSiN_3$:$Eu^{2+}$, $CaAlSiN_3$:Eu, or CaAlSi$(ON)_3$:Eu can be used.

Figure 12:
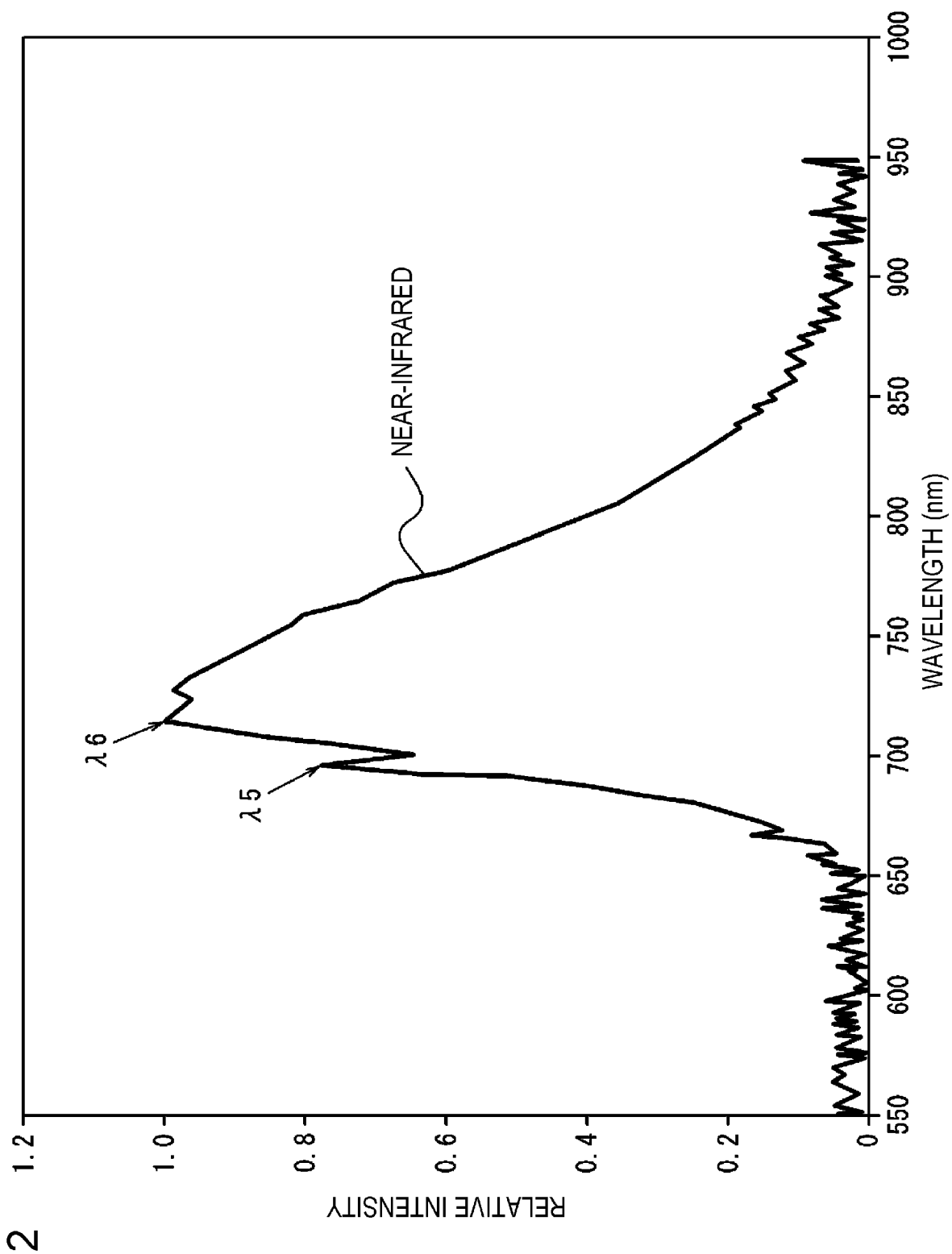
FIG. 12 is a graph showing a spectrum of near-infrared fluorescence.

The fifth fluorescent substance 65 may have a fifth peak wavelength indicated by λ5 and a sixth peak wavelength indicated by λ6 in the graph in FIG. 12. It is assumed that the fifth peak wavelength and the sixth peak wavelength are wavelengths within a wavelength range of 680 nm to 800 nm. The fifth fluorescent substance 65 emits, for example, near-infrared light. The near-infrared light may include light in a wavelength range of 680 to 2500 nm. As the fifth fluorescent substance 65, for example, $3Ga_5O_{12}$:Cr can be used.

The combination of the types of fluorescent substances contained in the wavelength conversion member 6 is not specifically limited. As indicated by the region X in FIG. 8 and FIG. 9, the wavelength conversion member 6 may have the first fluorescent substance 61, the second fluorescent substance 62, the third fluorescent substance 63, the fourth fluorescent substance 64, and the fifth fluorescent substance 65. The wavelength conversion member 6 may have other types of fluorescent substances.

The light emitting device 10 may include a plurality of wavelength conversion members 6. The wavelength conversion members 6 may have different combinations of fluorescent substances. The light emitting device 10 may include the light emitting element 3 that emits near-ultraviolet light to each wavelength conversion member 6. The light emitting device 10 can emit light rays having various spectra by controlling the intensity of near-ultraviolet light that enters each wavelength conversion member 6. The light emitting device 10 can, for example, emit light having a spectrum similar to the spectrum of direct sunlight from the sun. The light emitting device 10 can emit light rays for reproducing various environments on the basis of control information obtained from the spectrum control device 20.

Example Configuration of Spectrum Control System Including a Plurality of Light Emitting Devices The spectrum control system 1 according to one embodiment may include a plurality of light emitting devices 10. The spectrum control device 20 may control the spectra of light rays emitted by the respective light emitting devices 10 independently of each other. The spectrum control device 20 may control the spectra of light rays emitted by the respective light emitting devices 10 in association with each other. The spectrum control device 20 may control the spectra of light rays emitted by the respective light emitting devices 10 in association with each other to thereby control the spectrum of light obtained by combining the light rays emitted by the respective light emitting devices 10. The light obtained by combining the light rays emitted by the respective light emitting devices 10 is also called composite light.

The light emitting devices 10 may include a first light emitting device and a second light emitting device. The spectrum control device 20 may control the spectrum of light emitted by the first light emitting device and the spectrum of light emitted by the second light emitting device independently of each other or in association with each other. The spectrum control device 20 may control the spectrum of composite light obtained by combining light emitted by the first light emitting device and light emitted by the second light emitting device.

The spectrum control device 20 may, for example, control the spectrum of the composite light on the basis of a spectrum measurement result to thereby reproduce light having a spectrum the same as or similar to that of measurement target light as composite light. The spectrum control device 20 may, for example, control the spectrum of the composite light on the basis of spectrum reproduction information to thereby reproduce light in the reproduced environment as composite light.

Each light emitting device 10 may emit light having a peak wavelength in a wavelength range of 360 nm to 430 nm and also emit light having a peak wavelength in a wavelength range of 360 nm to 780 nm. Each light emitting device 10 may emit light having a peak wavelength in a wavelength range of 360 nm to 780 nm such that the composite light have a peak wavelength in a wavelength range of 360 nm to 780 nm.

<Obtaining Spectrum Information>

The spectrum control device 20 may not only obtain a spectrum measurement result as spectrum information but also obtain spectrum information with another method. For example, the spectrum control device 20 may obtain a piece of spectrum data 110 stored in an information processing device, such as an external server, and obtain spectrum information associated with the piece of spectrum data 110. With the piece of spectrum data 110 stored in the information processing device, a correspondence between the spectrum information including a spectrum measurement result and environment information is identified. The environment information includes measurement environment information or reproduced-environment information. With the piece of spectrum data 110, an environment is identified with the environment information and the spectrum of light with which the environment is illuminated is identified with the spectrum information. In other words, with the piece of spectrum data 110, the spectrum of light with which a certain environment is illuminated is identified with the spectrum information, and the environment illuminated with the light is identified with the environment information.

Example Configuration of Spectrum Control System Performing Feedback Control

The spectrum control system 1 according to one embodiment feeds the result of measurement of the spectrum of light emitted by the light emitting device 10 back for control of the light emitting device 10. The control unit 22 of the spectrum control device 20 obtains the result of measurement of the spectrum of light emitted by the light emitting device 10 while controlling the spectrum of light emitted by the light emitting device 10 on the basis of spectrum information and feeds the result of measurement of the spectrum of light back for control of the light emitting device 10. For example, the control unit 22 may control the spectrum of light emitted by the light emitting device 10 such that the result of measurement of the spectrum of light emitted by the light emitting device 10 becomes closer to a spectrum identified with the spectrum information. That is, the control unit 22 may feed the result of measurement by the measurement device 30 back to control the spectrum of light emitted by the light emitting device 10.

The control unit 22 may control the spectrum of light emitted by the light emitting device 10 on the basis of, for example, the intensity at a certain wavelength in the spectrum of light emitted by the light emitting device 10. The control unit 22 may control the spectrum of light emitted by the light emitting device 10 on the basis of, for example, the intensity of red light. The control unit 22 may obtain a measurement value of the intensity of red light in the light emitted by the light emitting device 10 and control the light emitting device 10 such that the measurement value becomes closer to a predetermined intensity. In a case where the measurement value of the intensity of red light in the light emitted by the light emitting device 10 is smaller than the predetermined intensity, the control unit 22 controls the light emitting device 10 so as to increase the intensity of red light. On the other hand, in a case where the measurement value of the intensity of red light in the light emitted by the light emitting device 10 is greater than the predetermined intensity, the control unit 22 controls the light emitting device 10 so as to decrease the intensity of red light. Accordingly, the control unit 22 can make the intensity of red light in the light emitted by the light emitting device 10 closer to the predetermined intensity. That is, the control unit 22 can feed a measurement value of the intensity of light emitted by the light emitting device 10 back for control of the spectrum of light emitted by the light emitting device 10.

The control unit 22 may control the intensity of each color included in the light emitted by the light emitting device 10 on the basis of the intensity of light in a color other than red, such as green or blue light. The control unit 22 may control the spectrum of light emitted by the light emitting device 10 on the basis of a measurement value of the intensity at the peak wavelength of light emitted by the light emitting device 10. The control unit 22 may control the spectrum of light emitted by the light emitting device 10 on the basis of a measurement value of the intensity at a wavelength different from the peak wavelength of light emitted by the light emitting device 10. For example, in a case where light emitted by the light emitting device 10 has a peak wavelength of red, the control unit 22 may control the intensity of red light emitted by the light emitting device 10 on the basis of a measurement value of the intensity of orange light close to red in the light emitted by the light emitting device 10. For example, in a case where light emitted by the light emitting device 10 has a peak wavelength of green, the control unit 22 may control the intensity of green light emitted by the light emitting device 10 on the basis of a measurement value of the intensity of yellow-green light close to green in the light emitted by the light emitting device 10.

It is supposed that the control unit 22 obtains a measurement value of the intensity at a specific wavelength of light emitted by the light emitting device 10. Regardless of whether the peak wavelength of light emitted by the light emitting device 10 and the specific wavelength match, the control unit 22 may control the intensity at the peak wavelength of light emitted by the light emitting device 10 on the basis of a measurement value of the intensity at the specific wavelength of light emitted by the light emitting device 10. In this case, the control unit 22 may control the light emitting device 10 on the basis of a table or an expression that expresses a relationship between a measurement value of the intensity at the specific wavelength and the intensity at the peak wavelength. The control unit 22 may obtain in advance the table or the expression. The table or the expression may correspond to a calibration curve.

The spectrum of light emitted by the light emitting device 10 or the intensity at the specific wavelength of light emitted by the light emitting device 10 may be measured by the measurement device 30 included in the spectrum control system 1. The control unit 22 may control the light emitting device 10 on the basis of a measurement value obtained from the measurement device 30. The spectrum of light emitted by the light emitting device 10 or the intensity at the specific wavelength of light emitted by the light emitting device 10 may be measured by a device not included in the spectrum control system 1.

Figure 13:
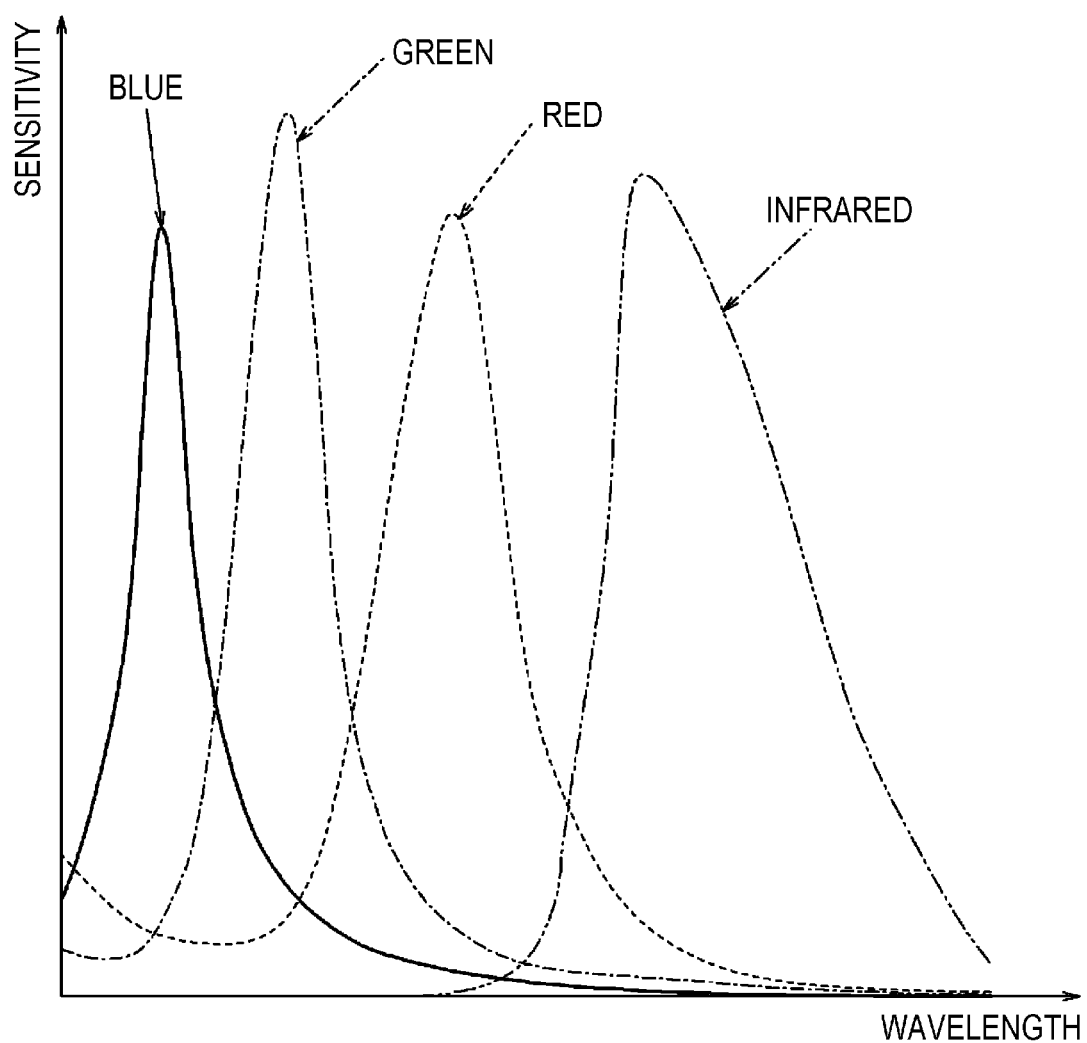
FIG. 13 is a graph showing example sensitivity curves of a device that measures a spectrum.
Figure 14:
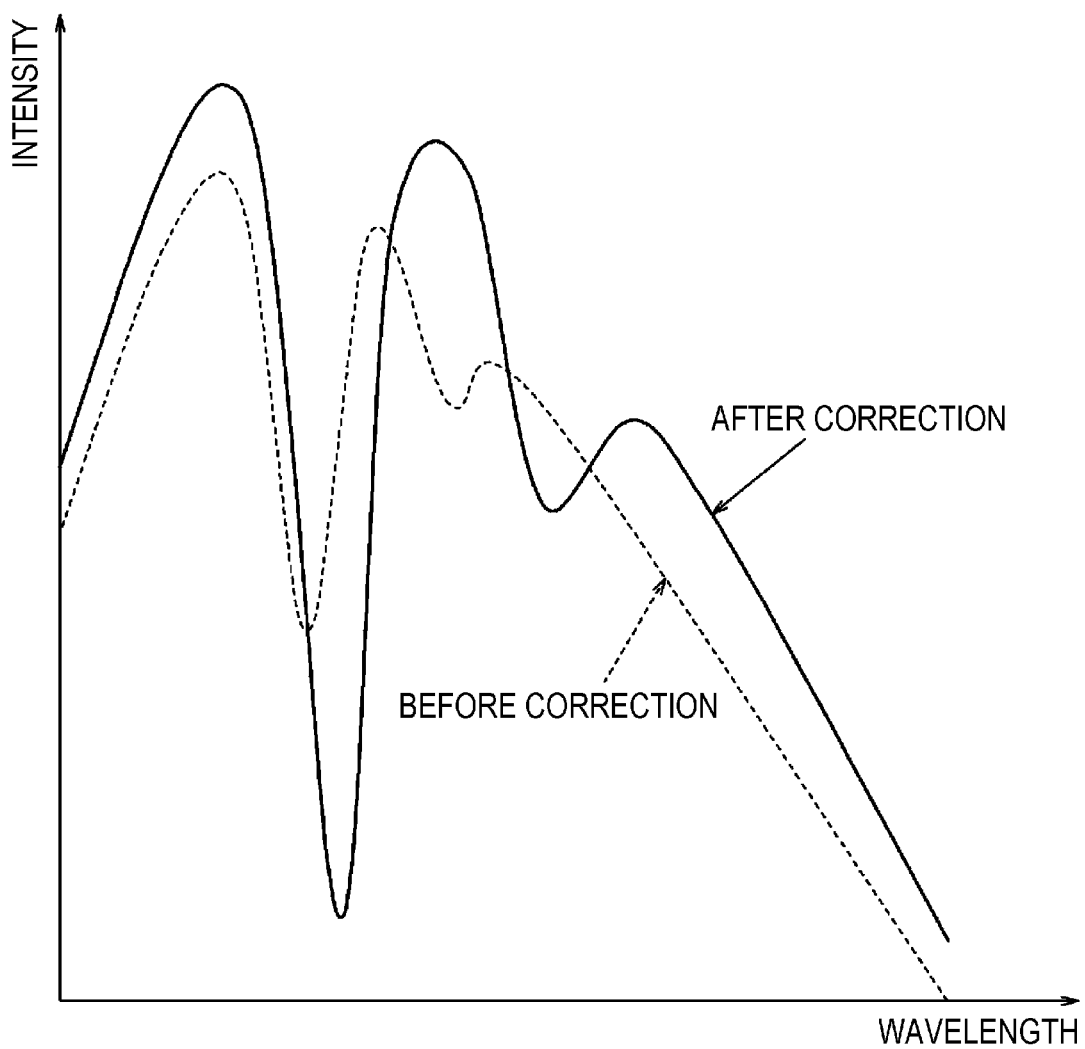
FIG. 14 is a graph showing example measurement values of a spectrum obtained by the device having the sensitivity curves illustrated in FIG. 13 and an example spectrum after correction based on the sensitivity curves.

The control unit 22 may correct a measurement value of the spectrum of light emitted by the light emitting device 10 on the basis of the sensitivity of the measuring device. The control unit 22 may control the light emitting device 10 on the basis of a correction value of the spectrum of light emitted by the light emitting device 10. Here, it is supposed that a device that measures the spectrum of light emitted by the light emitting device 10 has sensitivity curves identified with the graph illustrated in FIG. 13. The horizontal axis and the vertical axis of the graph in FIG. 13 respectively represent a wavelength and a sensitivity at each wavelength. The control unit 22 obtains measurement values of the spectrum from the device having the sensitivity curves illustrated in FIG. 13. The obtained values are represented by the dashed-line graph in FIG. 14. The horizontal axis and the vertical axis of the graph in FIG. 14 respectively represent a wavelength and an intensity at each wavelength. The control unit 22 makes a correction to obtain a spectrum represented by the solid-line graph in FIG. 14 on the basis of the sensitivity curves in FIG. 13. The dashed-line graph in FIG. 14 corresponds to the spectrum before correction. The solid-line graph in FIG. 14 corresponds to the spectrum after correction. The control unit 22 may control the light emitting device 10 on the basis of the spectrum after correction.

The control unit 22 may constantly perform the process for feeding back a measurement value of the spectrum of light emitted by the light emitting device 10 or may perform the process in a case where a specific condition is satisfied. The specific condition may be satisfied in a case where, for example, the difference between a measurement value of the intensity of light emitted by the light emitting device 10 and the intensity of light identified with spectrum information at a specific wavelength is greater than or equal to a predetermined value. In this case, the specific wavelength may be a wavelength at which the measurement sensitivity of the device that measures the spectrum is high. The specific condition may, for example, include a condition based on a threshold for the half value of a color filter.

<Grouping of Spectrum Data>

As described above, the spectrum control system 1 can reproduce on the basis of reproduced-environment information, the spectrum of light with which the environment is illuminated. The spectrum control system 1 extracts a piece of spectrum data 110 associated with measurement environment information the same as or similar to the reproduced-environment information. The spectrum control system 1 causes the light emitting device 10 to emit light identified with spectrum information associated with the extracted piece of spectrum data 110.

The control unit 22 of the spectrum control device 20 may obtain reproduced-environment information on the basis of information input to the input unit by a user. The control unit 22 may present environment information candidates associated with pieces of spectrum data 110 to the user. The spectrum control device 20 may further include an output unit that outputs the candidates to be presented to the user. The output unit may include any of the various displays, such as a liquid crystal display, an organic EL (electroluminescence) or inorganic EL display, or an LED (light emitting diode) display. The output unit may be included in the interface 26. The output unit may be formed as a touch panel so as to be integrated with the input unit. The control unit 22 may encourage the user to select one from among the presented candidates to make the user input reproduced-environment information. The control unit 22 may generate environment information candidates associated with pieces of spectrum data 110 on the basis of a keyword input from the user.

To present reproduced-environment information candidates to the user, the control unit 22 may display light identified with spectrum information associated with each candidate on the output unit or may cause the light emitting device 10 to emit the light. Accordingly, the user can easily select reproduced-environment information.

Pieces of spectrum data 110 may be grouped. Each of the grouped pieces of spectrum data 110 may be associated with a tag for identifying a group to which the piece of spectrum data 110 belongs. When pieces of spectrum data 110 are grouped, the control unit 22 can search for a group related to a keyword and extract pieces of environment information associated with pieces of spectrum data 110 belonging to the group. Accordingly, environment information candidates to be presented to the user can be easily generated.

<<Grouping Based on Environment Information>>

Pieces of spectrum data 110 may be grouped on the basis of environment information. In a case where pieces of spectrum data 110 are grouped on the basis of environment information, each piece of spectrum data 110 may be associated with a tag that indicates the name or features of a group to which the piece of spectrum data 110 belongs. Environment information may be associated with the tag. Pieces of spectrum data 110 may be grouped on the basis of, for example, the position or the time illustrated in the above description of measurement environment information. Pieces of spectrum data 110 may be grouped on the basis of a climatic zone among, for example, the temperate zone, the arid zone, the tropical zone, the subtropical zone, the polar zone, and the subpolar zone in which a position identified with environment information is included. Pieces of spectrum data 110 may be grouped on the basis of whether a position identified with environment information is included in, for example, a climatic zone having four seasons or a climatic zone having a dry season and a rainy season.

For example, in a case where a user inputs a keyword "spring in Kyoto", the control unit 22 may extract pieces of environment information associated with a point included in Kyoto prefecture or Kyoto city on the basis of a keyword "Kyoto". The control unit 22 may extract pieces of environment information in pieces of spectrum data 110 with which a tag having a name "Kyoto" or indicating features of "Kyoto" is associated. Further, the control unit 22 may limitedly extract pieces of environment information associated with the time of March to May on the basis of a keyword "spring". The control unit 22 may extract pieces of environment information in pieces of spectrum data 110 with which a tag having a name "spring" or indicating features of "spring" is associated. The control unit 22 may present extracted pieces of environment information to the user and encourage the user to make a selection to thereby obtain reproduced-environment information.

The control unit 22 may extract, for example, pieces of environment information in pieces of spectrum data 110 with which a tag that characterizes a point where cherry blossoms are in full bloom, which is characteristic of the season "spring", or a tag that characterizes a verdurous point is associated.

The control unit 22 may, for example, convert features of the season "spring" or features of the place "Kyoto" to a score and preferentially present pieces of environment information having a high score to the user. The control unit 22 may obtain data regarding pieces of environment information selected by other users and preferentially present to the user, pieces of environment information selected by a large number of users. The control unit may display content to be preferentially presented at a conspicuous position in the output unit or may highlight and display content to be preferentially presented on the output unit.

In a case where a phrase that expresses the season "spring" is included in a keyword, the control unit 22 may also present to the user, pieces of environment information with which a tag that characterizes another season, such as "summer", "fall", or "winter", is associated. The control unit 22 may present to the user, pieces of environment information with which a tag that characterizes a point, other than "Kyoto", where scenery characteristic of the season "spring" can be viewed is associated.

The control unit 22 may present to the user, pieces of environment information with which a tag that characterizes a point where changes in the seasons occur, namely, for example, a point included in the temperate zone, is associated, on the basis of the keyword "spring in Kyoto".

In a case where a phrase that expresses the place "Kyoto" is included in a keyword, the control unit 22 may also present to the user, for example, pieces of environment information associated with the name of another place, such as "Kamakura", "Kanazawa", or "Nara", suggestive of an impression similar to that of "Kyoto". In a case where a phrase that expresses the place "Hawaii" is included in a keyword, the control unit 22 may also present to the user, pieces of environment information with which a tag that has the name of another place, such as "Okinawa" or "Guam", suggestive of an impression similar to that of "Hawaii" or that characterizes such a place is associated.

The control unit 22 may automatically determine reproduced-environment information to be obtained on the basis of a keyword input by the user. On the basis of the automatically determined and obtained reproduced-environment information, the control unit 22 may cause the light emitting device 10 to emit light that reproduces the environment. The control unit 22 may, for example, on the basis of the fact that a phrase expressing the season "spring" is included in the keyword, automatically cause the light emitting device 10 to emit light that reproduces an environment in "spring". The control unit 22 may change light to be emitted by the light emitting device 10 to light that reproduces an environment in each of spring, summer, fall, and winter to reproduce changes in the seasons.

<<Grouping Based on Spectrum Information>>

Pieces of spectrum data 110 may be grouped on the basis of spectrum information. In a case where pieces of spectrum data 110 are grouped on the basis of spectrum information, each piece of spectrum data 110 may be associated with a tag that indicates the name or features of a group to which the piece of spectrum data 110 belongs. Spectrum information may be associated with the tag.

Pieces of spectrum data 110 may be grouped on the basis of, for example, pieces of spectrum information for identifying light rays having similar colors. In this case, a tag associated with a piece of spectrum data 110 or a piece of spectrum information may include the name of a color. Pieces of spectrum data 110 may be grouped on the basis of, for example, pieces of spectrum information for identifying light rays in primary colors. The primary colors may include, for example, the three primary colors of light, that is, red, green, and blue.

Pieces of spectrum data 110 may be grouped on the basis of, for example, pieces of spectrum information for identifying colors that are suggestive of a season. Colors suggestive of spring may include, for example, pink, yellow, and bright green. Colors suggestive of summer may include, for example, blue and green. Colors suggestive of fall may include, for example, red and yellow. Colors suggestive of winter may include, for example, white and a luminescent color of an LED used in illumination.

Pieces of spectrum data 110 may be grouped on the basis of, for example, pieces of spectrum information for identifying colors that are suggestive of the atmosphere of shrines or temples, churches, or mosques. Pieces of spectrum data 110 may be grouped on the basis of, for example, pieces of spectrum information for identifying candle light, paper lantern light, or garden lantern light. Pieces of spectrum data 110 may be grouped on the basis of, for example, pieces of spectrum information for identifying light in a temple in which, for example, Buddhist statues or Buddhist altar articles are arranged or light in a Shinto shrine in which, for example, ritual articles are arranged. Pieces of spectrum data 110 may be grouped on the basis of pieces of spectrum information for identifying, for example, light passing through stained glass of a church or light streaming through a skylight. Pieces of spectrum data 110 may be grouped on the basis of pieces of spectrum information for identifying, for example, light of a lamp illuminating a mosque.

Pieces of spectrum data 110 may be grouped on the basis of, for example, pieces of spectrum information for identifying light in a blue shade of, for example, the sky or the ocean suggestive of the atmosphere of a seaside resort. Pieces of spectrum data 110 may be grouped on the basis of, for example, pieces of spectrum information for identifying light in a warm color of, for example, a torch suggestive of the atmosphere of a ski resort.

In addition to the above-described examples, pieces of spectrum data 110 may be grouped on the basis of pieces of spectrum information for identifying light in a color suggested by any of the various keywords.

Even in a case where pieces of spectrum data 110 are grouped on the basis of spectrum information, the control unit 22 may present reproduced-environment information candidates to the user with a method similar to that in a case where pieces of spectrum data 110 are grouped on the basis of environment information.

Other Embodiment: Coordination Between Display of Image Data and Lighting

Figure 15:
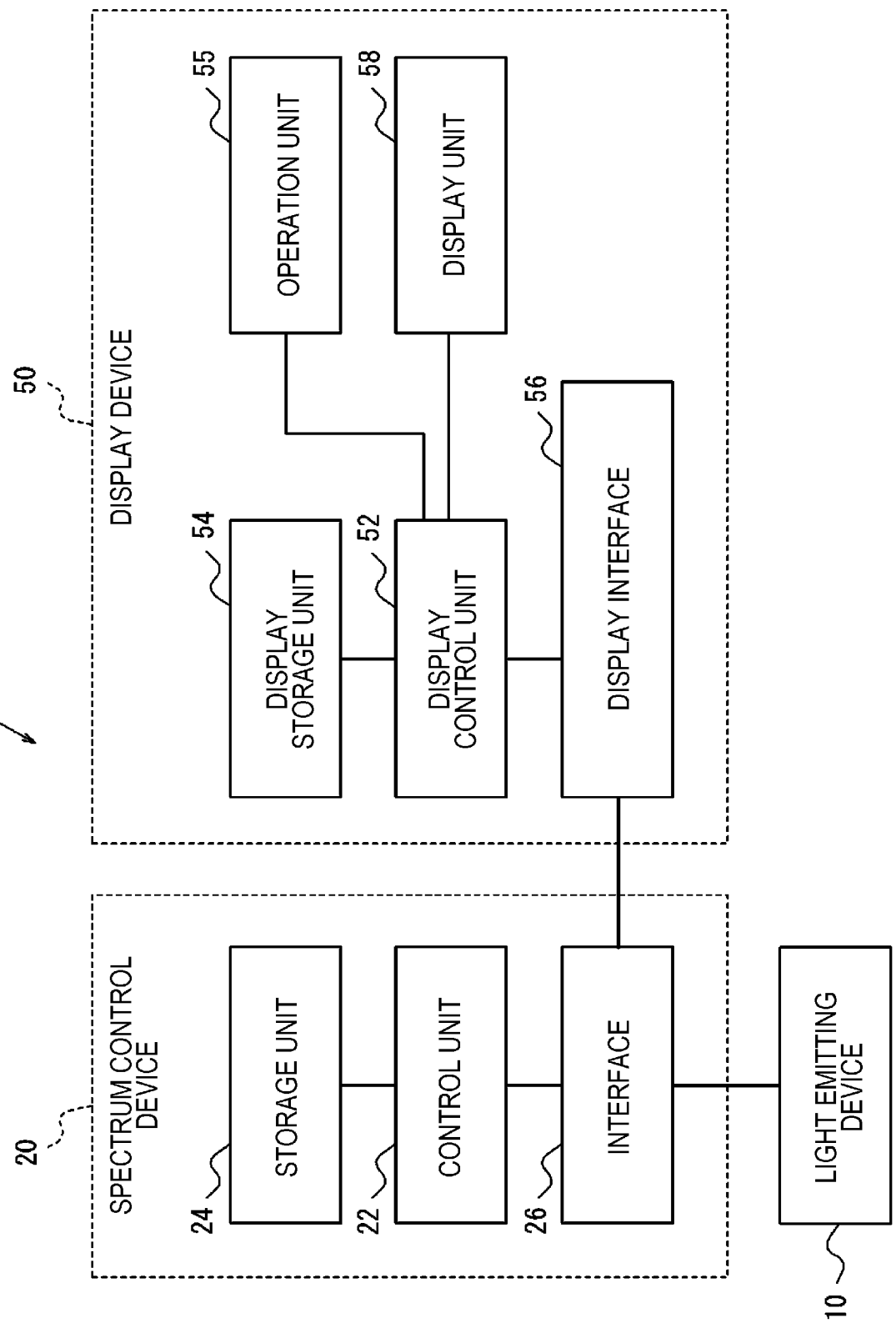
FIG. 15 is a block diagram illustrating an example configuration of the spectrum control system including a display device.

As illustrated in FIG. 15, the spectrum control system 1 according to one embodiment includes the light emitting device 10, the spectrum control device 20, and a display device 50. The spectrum control system 1 may further include the measurement device 30 and the camera 40 illustrated in FIG. 1. The configurations of the light emitting device 10 and the spectrum control device 20 are as described above, and therefore, descriptions thereof are omitted. This embodiment assumes that the spectrum control device 20 obtains in advance pieces of spectrum data 110; however, the spectrum control device 20 may generate spectrum information as appropriate.

In the spectrum control system 1 according to this embodiment, the display device 50 is placed in a specific space that is illuminated with light emitted by the light emitting device 10. The spectrum control system 1 makes an image displayed by the display device 50 and the spectrum of light emitted by the light emitting device 10 coordinate with each other. Accordingly, a user viewing the image displayed on the display device 50 in the specific space can have a feeling that the user is immersed in the circumstances where the image has been captured. Further, the user can easily empathize with the displayed image.

Example Configuration

The display device 50 includes a display control unit 52, a display storage unit 54, an operation unit 55, a display interface 56, and a display unit 58. The display control unit 52 controls the constituent units of the display device 50. The display control unit 52 may have a configuration the same as or similar to the configuration of the control unit 22 of the spectrum control device 20. The display storage unit 54 may have a configuration the same as or similar to the configuration of the storage unit 24 of the spectrum control device 20. The display storage unit 54 may store image data to be displayed on the display unit 58 by the display control unit 52.

The display interface 56 may have a configuration the same as or similar to the configuration of the interface 26 of the spectrum control device 20. The display interface 56 transmits and receives information or data to and from the interface 26 of the spectrum control device 20. The display interface 56 outputs information or data received from the interface 26 of the spectrum control device 20 to the display control unit 52 and transmits information or data obtained from the display control unit 52 to the interface 26 of the spectrum control device 20.

The operation unit 55 accepts input for the user of the spectrum control system 1 to operate the display device 50. The operation unit 55 may include an input device, such as a touch panel, a keyboard, or a mouse.

The display unit 58 displays an image based on data obtained from the display control unit 52. The display unit 58 may include, for example, a projection device, such as a projector. The display device 50 may include, for example, a display, such as a liquid crystal display, or an organic EL display or an inorganic EL display. The display may be formed as a monitor or a television or may be formed as a display device of a portable terminal, such as a smartphone or a tablet.

The display control unit 52 may cause the display unit 58 to display a still image or display a moving image. An image to be displayed on the display unit 58 by the display control unit 52 may be associated with at least one of information regarding the image capture position or information regarding the image capture date and time, or need not be associated with either information.

In a case where an operation for giving an instruction for display of an image from a user is accepted by the operation unit 55, the display control unit 52 may start display of the image on the display unit 58. The display control unit 52 may cause the display unit 58 to keep displaying one still image. The display control unit 52 may change a still image to be displayed on the display unit 58. That is, the display control unit 52 may cause the display unit 58 to display a plurality of still images. The display control unit 52 may change a still image at fixed intervals, at different intervals, or at random. The display control unit 52 may display still images in the order in which the still images are stored in the display storage unit 54 or may determine the order in which still images are displayed on the basis of another condition. The display control unit 52 may cause the display unit 58 to keep displaying a moving image.

Image data may be associated with information regarding a position at which the image was captured or information regarding the date and time at which the image was captured. Information associated with data of an image displayed on the display unit 58 is also called displayed-image information. In a case where image data is associated with displayed-image information, the display control unit 52 outputs the displayed-image information to the control unit 22 of the spectrum control device 20. When obtaining the displayed-image information, the control unit 22 controls the spectrum of light emitted by the light emitting device 10 on the basis of the displayed-image information. The control unit 22 may extract spectrum information associated with environment information that includes information the same as or similar to the displayed-image information among pieces of spectrum data 110 stored in advance in, for example, the storage unit 24. The control unit 22 may cause the light emitting device 10 to emit light identified with the extracted spectrum information.

In a case where image data is not associated with displayed-image information, the display control unit 52 may output the image data itself to the control unit 22. The control unit 22 may analyze, from the image data, the spectrum of light with which an environment in which the image was captured is illuminated. The control unit 22 may control the spectrum of light emitted by the light emitting device 10 on the basis of the spectrum analyzed from the image data. The control unit 22 may estimate the position or the date and time at which the image was captured from the image data. The control unit 22 may extract spectrum information associated with environment information that matches the estimated information or associated with environment information similar to the estimated information. The control unit 22 may cause the light emitting device 10 to emit light identified with the extracted spectrum information.

In the case where image data is not associated with displayed-image information, the display control unit 52 of the display device 50 or the control unit 22 of the spectrum control device 20 may output the image data itself to an external information processing device. The external information processing device may generate displayed-image information by analyzing the image data and output the displayed-image information to the display control unit 52 or the control unit 22. When obtaining the displayed-image information generated by the external information processing device, the display control unit 52 may output the obtained displayed-image information to the control unit 22 in association with the image data.

In a case where the display control unit 52 of the display device 50 has changed an image to be displayed on the display unit 58, the display control unit 52 outputs displayed-image information of the changed image or the image data itself to the control unit 22 of the spectrum control device 20. The control unit 22 may change the spectrum of light emitted by the light emitting device 10 in accordance with the change in the image displayed on the display unit 58.

As described above, the spectrum control system 1 according to this embodiment can make an image displayed on the display device 50 and the spectrum of light to be emitted by the light emitting device 10 coordinate with each other. Accordingly, a user viewing the image displayed on the display device 50 can have a feeling that the user is immersed in the circumstances where the image has been captured or the user can easily empathize with the displayed image.

Example Control of Change Frequency

In a case where the spectrum of light frequently changes, the user may have an uneasy feeling. In a case where an image to be displayed on the display unit 58 is changed at an interval shorter than a predetermined time, the control unit 22 of the spectrum control device 20 may perform control so as not to change the spectrum of light emitted by the light emitting device 10. The interval at which an image to be displayed on the display unit 58 is changed is also called a change interval. Even when obtaining displayed-image information or image data itself from the display device 50, the control unit 22 need not change the spectrum of light emitted by the light emitting device 10 in a case where the change interval is less than a first time. Control of not to change the spectrum of light in the case where the change interval is less than the first time may be implemented by the display control unit 52 of the display device 50 not outputting displayed-image information or image data itself to the spectrum control device 20 in the case where the change interval is less than the first time. When the change interval is made greater than or equal to the first time, the spectrum of light emitted by the light emitting device 10 is not changed for a period of the first time or more. Accordingly, the frequency of changes in the spectrum of light can be reduced. As a result, the user is less likely to have an uneasy feeling. Further, power consumption in a process of, for example, calculation for changing the spectrum can be reduced. The first time may be set so as to match the feeling of the user or may be set such that the power consumption matches a reduction target.

The control unit 22 may obtain from the display control unit 52, a schedule for changing an image to be displayed on the display unit 58. On the basis of the schedule for changing the image, the control unit 22 may generate a schedule for changing the spectrum of light emitted by the light emitting device 10. Accordingly, the spectrum control system 1 can change the spectrum of light emitted by the light emitting device 10 without giving the user an uneasy feeling. Further, when the spectrum is changed in a planned manner, power consumption for changing the spectrum can be reduced.

Example Coordination with Moving-Image Display

The control unit 22 of the spectrum control device 20 may make the spectrum of light to be emitted by the light emitting device 10 coordinate with the content of a moving image displayed on the display device 50. The moving image is displayed at a frame rate of, for example, 60 hertz or 120 hertz. In a case where the control unit 22 causes the spectrum to follow the content of each frame, the frequency with which the spectrum changes increases. The control unit 22 may divide the content of the moving image into scenes and generate spectrum information corresponding to each scene. The control unit 22 may change the spectrum of light to be emitted by the light emitting device 10 for each scene. In a case where, for example, a scene of a room illuminated by a candle is displayed on the display device 50, the control unit 22 may make the spectrum of light to be emitted by the light emitting device 10 match the spectrum of the candle light. When the scene displayed on the display device 50 is switched to an outdoor scene, the control unit 22 may change the spectrum of light to be emitted by the light emitting device 10 so as to match the spectrum of outdoor light. In a case where, for example, an image of a live performance venue is displayed on the display device 50, the control unit 22 may change the spectrum of light to be emitted by the light emitting device 10 in accordance with lighting of the stage or the venue that differs depending on the played piece of music. Accordingly, the user can easily have a feeling that the user is immersed in each scene of the moving image displayed on the display device 50 or can easily empathize with the displayed image.

In a case where a moving image displayed on the display device 50 includes content, such as an advertisement, not related to the main content, the control unit 22 may make the spectrum of light to be emitted by the light emitting device 10 coordinate with the displayed image only during display of the main content. The control unit 22 may stop the coordination between the displayed image and the light to be emitted by the light emitting device 10 during display of content, such as an advertisement, not related to the main content. In a case of stopping the coordination, the control unit 22 may make the spectrum of light to be emitted by the light emitting device 10 match an initially set spectrum or a separately set spectrum. When the spectrum is controlled in different manners in a case where the content of a moving image is the main content and in a case where the content of the moving image is not the main content, the user can determine whether the main content is displayed without closely watching the image displayed on the display device 50.

Example of Spatial Lighting Control

Two or more light emitting devices 10 may be placed in one room that is a specific space. For example, the light emitting device 10 that illuminates the ceiling of a room, the light emitting device 10 that illuminates the walls thereof, and the light emitting device 10 that illuminates the floor thereof may be separately placed. The control unit 22 of the spectrum control device 20 may make the spectra of light rays with which the respective parts of the room are illuminated differ in accordance with an image displayed on the display device 50. In a case where, for example, an image in which green grass spreads under the blue sky is displayed on the display device 50, the control unit 22 may make the spectrum of light with which the ceiling of the room is illuminated match the color of the blue sky and make the spectrum of light with which the floor of the room is illuminated match the color of the grass. Accordingly, the user can easily have a feeling that the user is immersed in the image displayed on the display device 50 or can easily empathize with the displayed image.

Example of Lighting Control for a Plurality of Rooms

In, for example, a dwelling unit or an office having a plurality of rooms, the spectrum control system 1 may include, for each room, the light emitting device 10 that emits light with which the room is illuminated. The control unit 22 of the spectrum control device 20 controls the light emitting device 10 in each room to control the spectrum of light with which the room is illuminated.

It is assumed that the display device 50 is placed in one room among the plurality of rooms. The control unit 22 may control only the light emitting device 10 in the room in which the display device 50 is placed and make the spectrum of light emitted by the light emitting device 10 that is a control target coordinate with an image displayed on the display device 50. Accordingly, power consumption in a process of, for example, calculation for changing the spectrum can be reduced.

The control unit 22 may also control the light emitting device 10 in a room in which the display device 50 is not placed and make the spectrum of light emitted by the light emitting device 10 that is a control target coordinate with an image displayed on the display device 50. Accordingly, a user who is present in the room in which the display device 50 is not placed can share the atmosphere of the room in which the display device 50 is placed.

The spectrum control system 1 may include a sensor, such as a human detecting sensor, that detects whether a user is present in each room. The control unit 22 of the spectrum control device 20 may obtain information regarding the state of presence of a user in each room. The control unit 22 may obtain the information regarding the state of presence of a user from the sensor included in the spectrum control system 1 or from an external sensor. The control unit 22 may control only the light emitting device 10 in a room in which a user is present and make the spectrum of light emitted from the light emitting device 10 that is a control target coordinate with an image displayed on the display device 50. Accordingly, power consumption in a process of, for example, calculation for changing the spectrum can be reduced.

Example Flowchart

Figure 16:
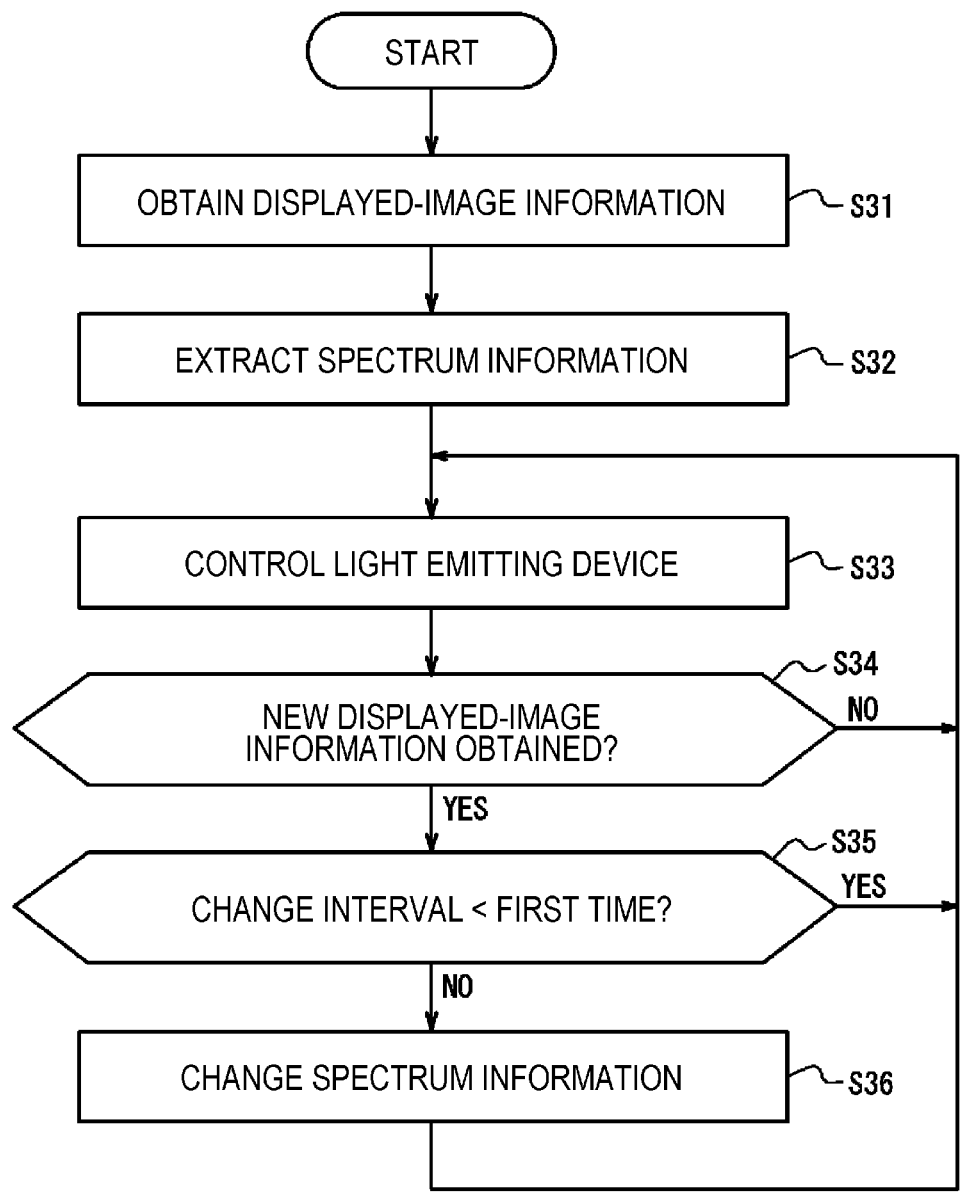
FIG. 16 is a flowchart illustrating an example procedure for controlling a spectrum on the basis of an image displayed on the display device.

The control unit 22 of the spectrum control device 20 may perform a spectrum control method including the procedure illustrated by the flowchart in FIG. 16. The spectrum control method may be implemented as the spectrum control program to be executed by the processor.

The control unit 22 obtains displayed-image information from the display device 50 (step S31). The control unit 22 may obtain displayed image data itself from the display device 50 and generate displayed-image information on the basis of the image data. The control unit 22 may obtain displayed-image information from an external information processing device.

The control unit 22 extracts spectrum information from pieces of spectrum data 110 on the basis of the displayed-image information (step S32).

The control unit 22 controls the light emitting device 10 on the basis of the spectrum information (step S33). The control unit 22 causes the light emitting device 10 to emit light identified with the spectrum information.

The control unit 22 determines whether the control unit 22 obtains new displayed-image information from the display device 50 (step S34). The control unit 22 may determine that the control unit 22 obtains new displayed-image information in a case where the control unit 22 obtains new image data from the display device 50. If the control unit 22 does not obtain new displayed-image information (NO in step S34), the flow returns to the procedure in step S33, and the control unit 22 continuously controls the light emitting device 10 without changing the spectrum information.

If the control unit 22 obtains new displayed-image information from the display device 50 (YES in step S34), the control unit 22 determines whether the change interval is less than the first time (step S35). If the change interval is less than the first time (YES in step S35), the flow returns to the procedure in step S33, and the control unit 22 continuously controls the light emitting device 10 without changing the spectrum information.

If the change interval is not less than the first time (NO in step S35), that is, if the change interval is greater than or equal to the first time, the control unit 22 changes the spectrum information (step S36). The control unit 22 changes the spectrum information by extracting spectrum information from pieces of spectrum data 110 on the basis of the new displayed-image information. After the procedure in step S36, the flow returns to the procedure in step S33, and the control unit 22 continuously controls the light emitting device 10 on the basis of the changed spectrum information.

Figure 17:
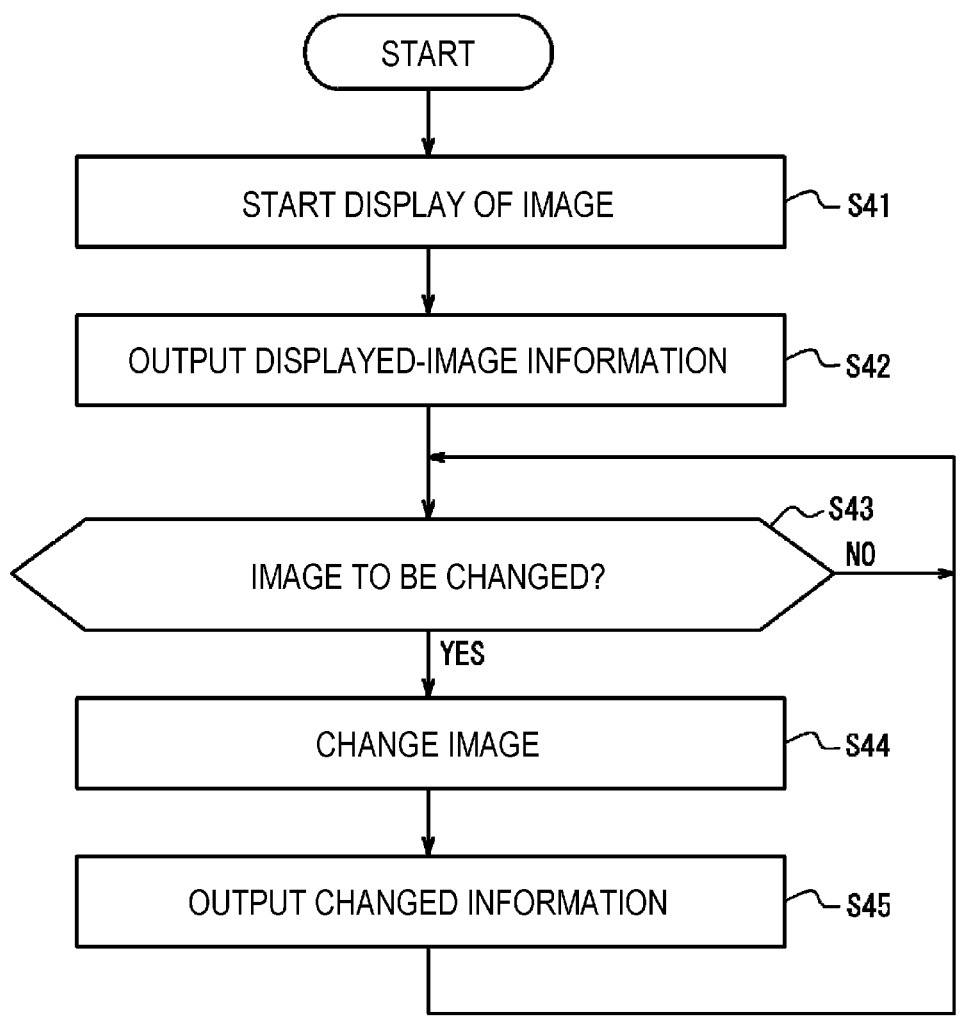
FIG. 17 is a flowchart illustrating an example procedure performed by the display device.

The display control unit 52 of the display device 50 may perform an image display method including the procedure illustrated by the flowchart in FIG. 17. The image display method may be implemented as an image display program to be executed by a processor.

The display control unit 52 starts display of an image on the display unit 58 (step S41). The display control unit 52 may start display of an image on the display unit 58 when operation input for starting display of an image from a user is accepted by the operation unit 55. In a case where an image to be displayed is specified by the operation input from the user, the display control unit 52 may display the specified image on the display unit 58. In a case where an image to be displayed is not specified, the display control unit 52 may select an image to be displayed on the display unit 58 as appropriate.

The display control unit 52 outputs displayed-image information to the spectrum control device 20 (step S42). In a case where displayed-image information is not associated with the image to be displayed on the display unit 58, the display control unit 52 may output image data itself of the image to be displayed on the display unit 58 to the spectrum control device 20.

The display control unit 52 determines whether to change the image to be displayed on the display unit 58 (step S43). The display control unit 52 may determine that the image to be displayed on the display unit 58 is to be changed in a case where operation input for changing the image from the user is obtained by the operation unit 55. The display control unit 52 may determine that the image to be displayed on the display unit 58 is to be changed to a new image in a case where the period for which the same image is displayed on the display unit 58 exceeds a predetermined period. If the display control unit 52 determines that the image to be displayed on the display unit 58 is not to be changed (NO in step S43), the display control unit 52 repeats the procedure for determination in step S44.

If the display control unit 52 determines that the image to be displayed on the display unit 58 is to be changed (YES in step S43), the display control unit 52 changes the image to be displayed on the display unit 58 to an image different from the currently displayed image (step S44). The display control unit 52 may change the image to be displayed on the display unit 58 to an image specified by operation input from the user. The display control unit 52 may change the image to be displayed on the display unit to an image selected as appropriate by the display control unit 52.

The display control unit 52 outputs displayed-image information associated with the changed image to the spectrum control device 20 (step S45). In a case where displayed-image information is not associated with the changed image, the display control unit 52 may output image data itself of the image to be displayed on the display unit 58 to the spectrum control device 20. After the display control unit 52 performs the procedure in step S45, the flow returns to the procedure in step S43.

A configuration has been described above in which the control unit 22 of the spectrum control device 20 determines, on the basis of information obtained from the display device 50, the spectrum of light to be emitted by the light emitting device 10 in order to illuminate a specific space in which the display device 50 is placed. Accordingly, a user viewing an image displayed on the display device 50 can easily have a feeling that the user is immersed in the image displayed on the display device 50 or can easily empathize with the displayed image.

Determination or changing of the spectrum of light to be emitted by the light emitting device 10 may be performed not only by the spectrum control device 20 but also by the display device 50. That is, the display control unit 52 of the display device 50 may determine or change the spectrum of light to be emitted by the light emitting device 10 and output the determined or changed spectrum to the control unit 22 of the spectrum control device 20.

Other Embodiment: Coordination with Lighting During Video Call

Figure 18:
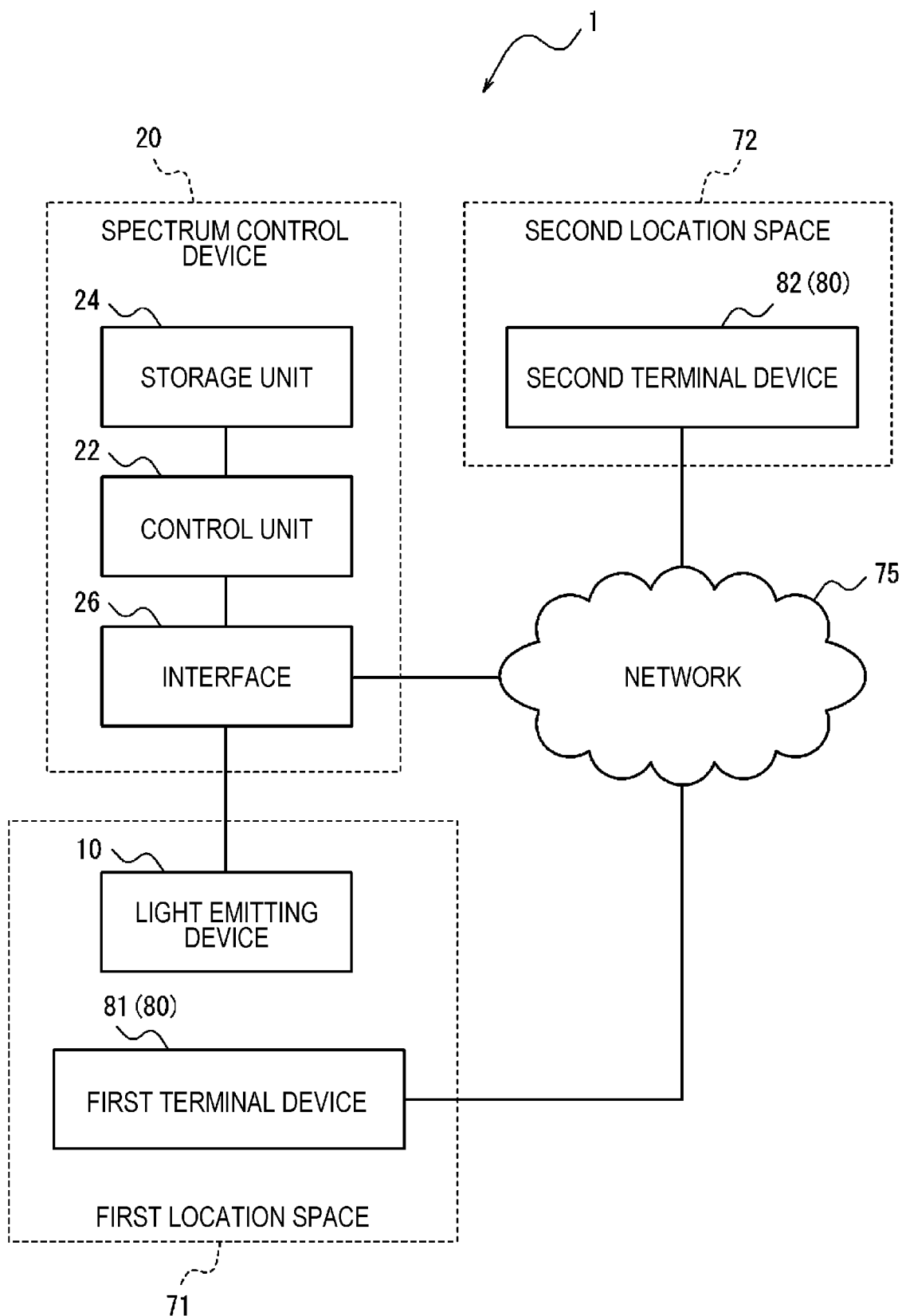
FIG. 18 is a block diagram illustrating an example configuration of the spectrum control system including terminal devices.

As illustrated in FIG. 18, the spectrum control system 1 according to one embodiment includes the light emitting device 10, the spectrum control device 20, a first terminal device 81, and a second terminal device 82. It is assumed that the first terminal device 81 and the second terminal device 82 are collectively called terminal devices 80. The configurations of the light emitting device 10 and the spectrum control device 20 are as described above, and therefore, descriptions thereof are omitted. This embodiment assumes that the spectrum control device 20 obtains in advance pieces of spectrum data 110; however, the spectrum control device 20 may generate spectrum information as appropriate.

In the spectrum control system 1 according to this embodiment, the terminal devices 80 are communicably connected to each other via a network 75. The users of the terminal devices 80 can communicate with each other through a video call by an application program running on the terminal devices 80. In the video call, the user of each terminal device 80 can talk while viewing an image transmitted from the other terminal device 80 in real time.

Example Configuration of Terminal Device 80

Figure 19:
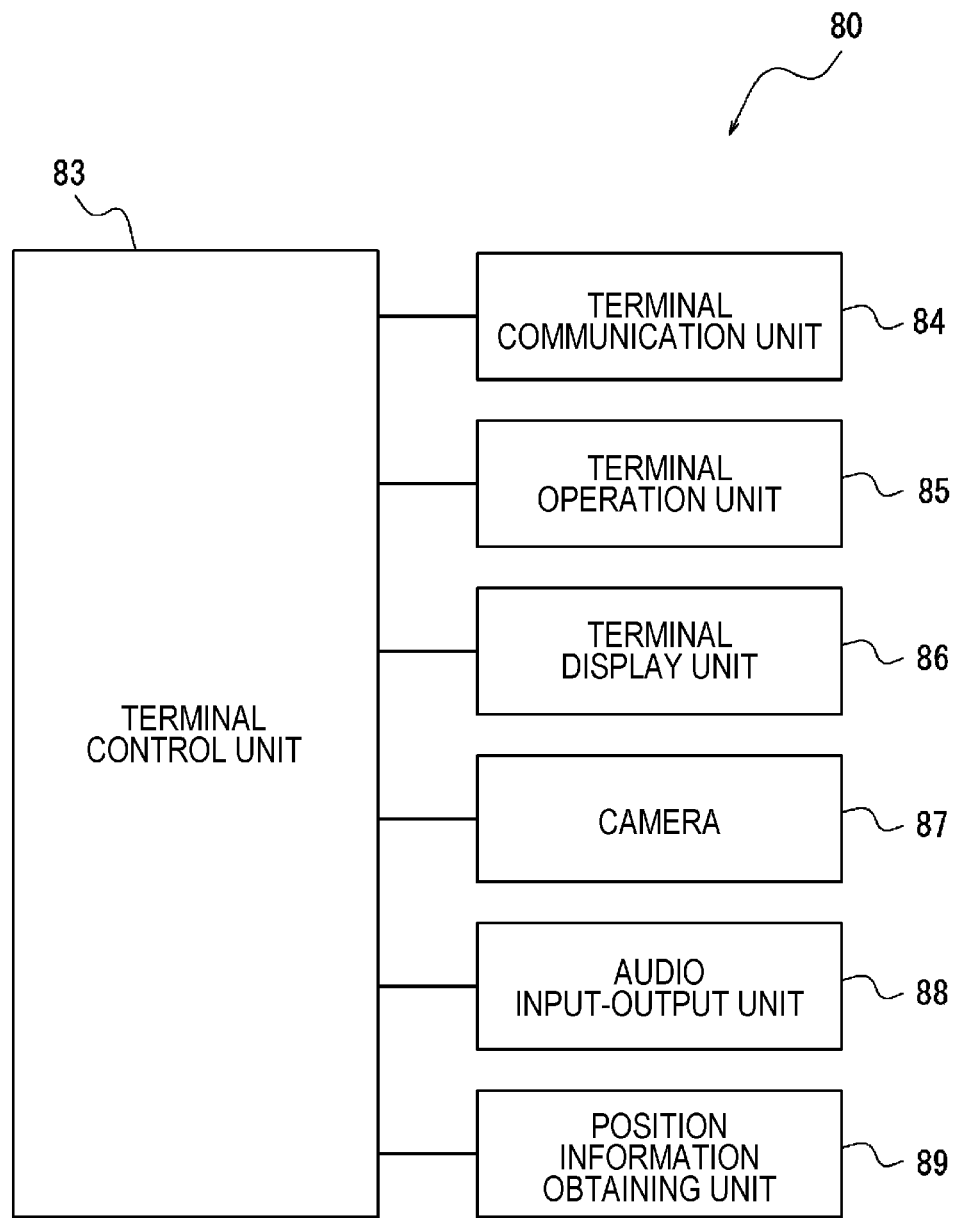
FIG. 19 is a block diagram illustrating an example configuration of a terminal device.

As illustrated in FIG. 19, the terminal device 80 includes a terminal control unit 83, a terminal communication unit 84, a terminal operation unit 85, a terminal display unit 86, a camera 87, and an audio input-output unit 88. The terminal device 80 may further include a position information obtaining unit 89.

The terminal control unit 83 controls the constituent units of the terminal device 80. The terminal control unit 83 may have a configuration the same as or similar to the configuration of the control unit 22 of the spectrum control device 20. The terminal control unit 83 may include a terminal storage unit. The terminal storage unit stores, for example, various types of information to be used in operations of the terminal device 80 and a program executed by the terminal control unit 83. The terminal storage unit may function as a work memory of the terminal control unit 83. At least part of the terminal storage unit may be configured separately from the terminal control unit 83. The terminal control unit 83 of the first terminal device 81 is also called a first terminal control unit. The terminal control unit 83 of the second terminal device 82 is also called a second terminal control unit.

The terminal communication unit 84 communicably connects the terminal device 80 with the network 75. The terminal communication unit 84 transmits information input from the terminal control unit 83 to the other terminal device 80 or the spectrum control device 20 via the network 75. The terminal communication unit 84 outputs information received from the other terminal device 80 or the spectrum control device 20 via the network 75 to the terminal control unit 83. The terminal communication unit 84 may be connected to the network 75 by wire or wirelessly. The terminal communication unit 84 may include a communication interface for, for example, a LAN. The terminal communication unit 84 may implement communication conforming to any of the various communication methods, such as 4G or LTE, or 5G. The terminal communication unit 84 of the first terminal device 81 is also called a first terminal communication unit. The terminal communication unit 84 of the second terminal device 82 is also called a second terminal communication unit.

The terminal operation unit 85 accepts input for the user of the terminal device 80 to operate the terminal device 80. The terminal operation unit 85 may include an input device, such as a touch panel, a keyboard, or a mouse. The terminal operation unit 85 of the first terminal device 81 is also called a first terminal operation unit. The terminal operation unit 85 of the second terminal device 82 is also called a second terminal operation unit.

The terminal display unit 86 displays an image based on data obtained from the terminal control unit 83. The terminal display unit 86 may include a display, such as a liquid crystal display, or an organic EL display or an inorganic EL display. The terminal display unit 86 of the first terminal device 81 is also called a first terminal display unit. The terminal display unit 86 of the second terminal device 82 is also called a second terminal display unit.

In a case where the terminal device 80 is used in a video call, the camera 87 captures an image of the user of the terminal device 80 as a subject and outputs the captured image to the terminal control unit 83. The camera 87 may include an imaging element. The imaging element may include, for example, a CMOS image sensor or a CCD. The camera 87 of the first terminal device 81 is also called a first terminal camera. The camera 87 of the second terminal device 82 is also called a second terminal camera.

The audio input-output unit 88 includes an audio input device, such as a microphone, that obtains a sound uttered by the user of the terminal device 80 or a sound around the user in a case where the terminal device 80 is used in a video call. The audio input-output unit 88 outputs audio data based on the input sound to the terminal control unit 83. The audio input-output unit 88 includes an audio output device, such as a speaker, that outputs audio data transmitted from the terminal device 80 on the other side of the video call. The audio input-output unit 88 of the first terminal device 81 is also called a first audio input-output unit. The audio input-output unit 88 of the second terminal device 82 is also called a second audio input-output unit.

The position information obtaining unit 89 obtains and outputs to the terminal control unit 83, position information of the terminal device 80. The position information of the terminal device 80 may include information regarding the latitude or the longitude, or the altitude. The position information obtaining unit 89 may obtain position information of the terminal device 80 on the basis of, for example, a GNSS technique. The GNSS technique may include a satellite positioning system, such as GPS, GLONASS, Galileo, or Quasi-Zenith Satellite (QZSS). The position information obtaining unit 89 of the first terminal device 81 is also called a first position information obtaining unit. The position information obtaining unit 89 of the second terminal device 82 is also called a second position information obtaining unit.

The terminal devices 80 include the first terminal device 81 and the second terminal device 82. The first terminal device 81 corresponds to the terminal device 80 that is used by a first user in a video call. The second terminal device 82 corresponds to the terminal device 80 that is used by a second user in a video call. It is assumed that the first user and the second user communicate with each other through a video call when the first user and the second user are present in a first location space 71 and a second location space 72, respectively. It is assumed that the first location space 71 is illuminated with light emitted by the light emitting device 10. That is, the spectrum control system 1 can control the spectrum of light with which the first location space 71 in which the first user is present is illuminated.

The spectrum control device 20 is connected to the network 75 via the interface 26 so as to be communicable with the terminal devices 80. The spectrum control device 20 may obtain from the terminal devices 80, images transmitted and received in a video call. The spectrum control device 20 may obtain position information from the terminal devices 80.

Example Operation of Video Call in Terminal Devices 80

In the first terminal device 81, the first terminal operation unit accepts input for starting a video call from the first user. The first terminal operation unit also accepts input of information for identifying the other side of the video call. The first terminal control unit identifies the second terminal device 82 that is the other side of the video call on the basis of the information input to the first terminal operation unit. The first terminal control unit starts communication with the second terminal device 82 via the first terminal communication unit.

The first user and the second user can communicate with each other through a video call by using the first terminal device 81 and the second terminal device 82, respectively. An image in which the first user and their background or surroundings are present is displayed on the second terminal display unit. An image in which the second user and their background or surroundings are present is displayed on the first terminal display unit.

The control unit 22 of the spectrum control device 20 may cause the light emitting device 10 to emit to the first location space 71, light the same as or similar to light with which the second location space 72 is illuminated, on the basis of information obtained from the second terminal device 82. Accordingly, the first location space 71 in which the first user is present is illuminated with light having a spectrum the same as or similar to the spectrum of light with which the second location space 72 is illuminated. As a result, the first user can be present in the space illuminated with light the same as or similar to light in the space in which the second user is present, and can have a feeling that the first user shares the space with the second user.

The control unit 22 may automatically start, when the first terminal device 81 starts a video call, control for making the spectrum of light emitted to the first location space 71 by the light emitting device 10 match the spectrum of light with which the second location space 72 is illuminated.

The control unit 22 may obtain from the first terminal device 81, information indicating that an instruction for starting control for making the spectrum of light emitted to the first location space 71 by the light emitting device 10 match the spectrum of light with which the second location space 72 is illuminated is input to the first terminal operation unit. When obtaining the information indicating that the instruction is input to the first terminal operation unit, the control unit 22 may start control for making the spectrum of light emitted to the first location space 71 by the light emitting device 10 match the spectrum of light with which the second location space 72 is illuminated. The first terminal operation unit may accept operation input by the first user by, for example, encouraging the first user to click or tap an icon or a menu displayed on the first terminal display unit.

The control unit 22 may notify the second user that the instruction for starting control for making the spectrum of light emitted by the light emitting device 10 match the spectrum of light with which the second location space 72 is illuminated is input to the first terminal operation unit. For example, the second terminal device 82 may display on the second terminal display unit, the fact that a request for starting control for making light with which the first location space 71 is illuminated match light with which the second location space 72 is illuminated is made by the first user. The control unit 22 accepts from the second user via the second terminal operation unit, input for agreeing to start control for making light with which the first location space 71 is illuminated match light with which the second location space 72 is illuminated and transmits the input to the control unit 22. When confirming the agreement by the second user, the control unit 22 starts control for making the spectrum of light emitted to the first location space 71 by the light emitting device 10 match the spectrum of light with which the second location space 72 is illuminated.

The control unit 22 may obtain an image captured by the second terminal camera from the second terminal device 82 and control the spectrum of light emitted by the light emitting device 10 on the basis of the obtained image. The control unit 22 may perform, for example, the following process. The control unit 22 analyzes an image, obtained from the second terminal device 82, in which the second user and their background or surroundings are present and generates spectrum information for identifying the spectrum of light with which the second location space 72 is illuminated. The control unit 22 causes the light emitting device 10 to emit light identified on the basis of the spectrum information.

The control unit 22 may obtain position information of the second terminal device 82 from the second terminal device 82 and control light to be emitted by the light emitting device 10 on the basis of the obtained position information. The control unit 22 may perform, for example, the following process. The control unit 22 extracts a piece of environment information for identifying a position within a predetermined range from the current position of the second terminal device 82 among pieces of environment information associated with pieces of spectrum data 110. Further, the control unit 22 extracts a piece of environment information for identifying a time within a predetermined period from the current time at which the video call is in progress. The control unit 22 obtains a piece of spectrum data 110 associated with the pieces of environment information extracted on the basis of the current position of the second terminal device 82 and the current time at which the video call is in progress. The control unit 22 causes the light emitting device 10 to emit light identified on the basis of spectrum information associated with the obtained piece of spectrum data 110.

While the video call is in progress, the current time changes. The control unit 22 may newly extract a piece of environment information as the current time changes. The control unit 22 may obtain a piece of spectrum data 110 associated with the newly extracted piece of environment information. The control unit 22 may change light to be emitted by the light emitting device 10 on the basis of spectrum information associated with the newly obtained piece of spectrum data 110. The control unit 22 may change the spectrum information after an elapse of a predetermined time. The predetermined time may be set to, for example, one hour; however, the predetermined time is not limited to this and may be set as appropriate.

While the video call is in progress, the second user and the second terminal device 82 used by the second user may move. The control unit 22 may newly extract a piece of environment information in accordance with a change in position information of the second terminal device 82. The control unit 22 may obtain a piece of spectrum data 110 associated with the newly extracted piece of environment information. The control unit 22 may change light to be emitted by the light emitting device 10 on the basis of spectrum information associated with the newly obtained piece of spectrum data 110. The control unit 22 may change the spectrum information when the position of the second terminal device 82 moves by a predetermined distance or more. The predetermined distance may be set to, for example, 10 km; however, the predetermined distance is not limited to this and may be set as appropriate.

It is assumed that the first user is present in a certain room in a dwelling unit or an office having a plurality of rooms and can move to another room. The room in which the first user is present corresponds to the first location space 71. It is assumed that the spectrum control system 1 includes, in each room, the light emitting device 10 that emits light with which the room is illuminated. The spectrum control system 1 may include, in each room, a sensor, such as a human detecting sensor, in order to detect a room in which the first user is present. The control unit 22 may obtain information for identifying a room in which the first user is present and control only the light emitting device 10 placed in the room in which the first user is present on the basis of information regarding the second terminal device 82. Accordingly, power consumption in a process of, for example, calculation for changing the spectrum can be reduced. The control unit 22 may obtain information indicating that the first user has moved to another room, start control of the light emitting device in the other room to which the first user has moved, and terminate control of the light emitting device 10 in the room that the first user has left.

In a case where the call between the first terminal device 81 and the second terminal device 82 ends, the control unit 22 may terminate control of the light emitting device 10 based on information regarding the second terminal device 82. In a case where control by the control unit 22 ends, the light emitting device 10 may emit light identified with a spectrum set in advance.

The call between the first terminal device 81 and the second terminal device 82 can include a video call and an audio call. In the audio call, images are not transmitted or received between the terminal devices 80. In a case where the call is switched to a call including only an audio call, the control unit 22 may terminate control of the light emitting device 10 based on information regarding the second terminal device 82. Even in the case where the call is switched to a call including only an audio call, the control unit 22 may continuously control the light emitting device 10 on the basis of position information of the second terminal device 82 and the current time.

In the above description, the light emitting device 10 is placed in the first location space 71 but it is not identified whether the light emitting device 10 is placed in the second location space 72. In a case where the light emitting device 10 is also placed in the second location space 72, the control unit 22 may regard one of the light emitting device 10 placed in the first location space 71 or the light emitting device 10 placed in the second location space 72 as a master device. The control unit 22 may regard the other light emitting device 10 as a slave device. The control unit 22 may control the spectrum of light with which the space in which the light emitting device 10 regarded as the master device is located is illuminated while the control unit 22 may stop control of the light emitting device 10 regarded as the slave device. Accordingly, a state where light rays emitted by the two light emitting devices 10 are mutually fed back and the control state is not converged can be avoided. The control unit 22 may determine the light emitting device 10 that is regarded as a master device on the basis of input from a user.

In this embodiment, control of the light emitting device 10 in a case where a video call is made between two terminal devices 80 has been described. The operations in this embodiment are also applicable to a case where a video call is made among three or more terminal devices 80. In a case where spaces in which the terminal devices 80 that are call destinations are respectively located are present at two or more locations, the control unit 22 may select a space at any one of the locations and control the spectra of light rays to be emitted by the light emitting devices on the basis of light with which the selected space is illuminated. The control unit 22 may select a space at one location from among the spaces at the two or more locations on the basis of operation input from a user.

Example Flowchart

Figure 20:
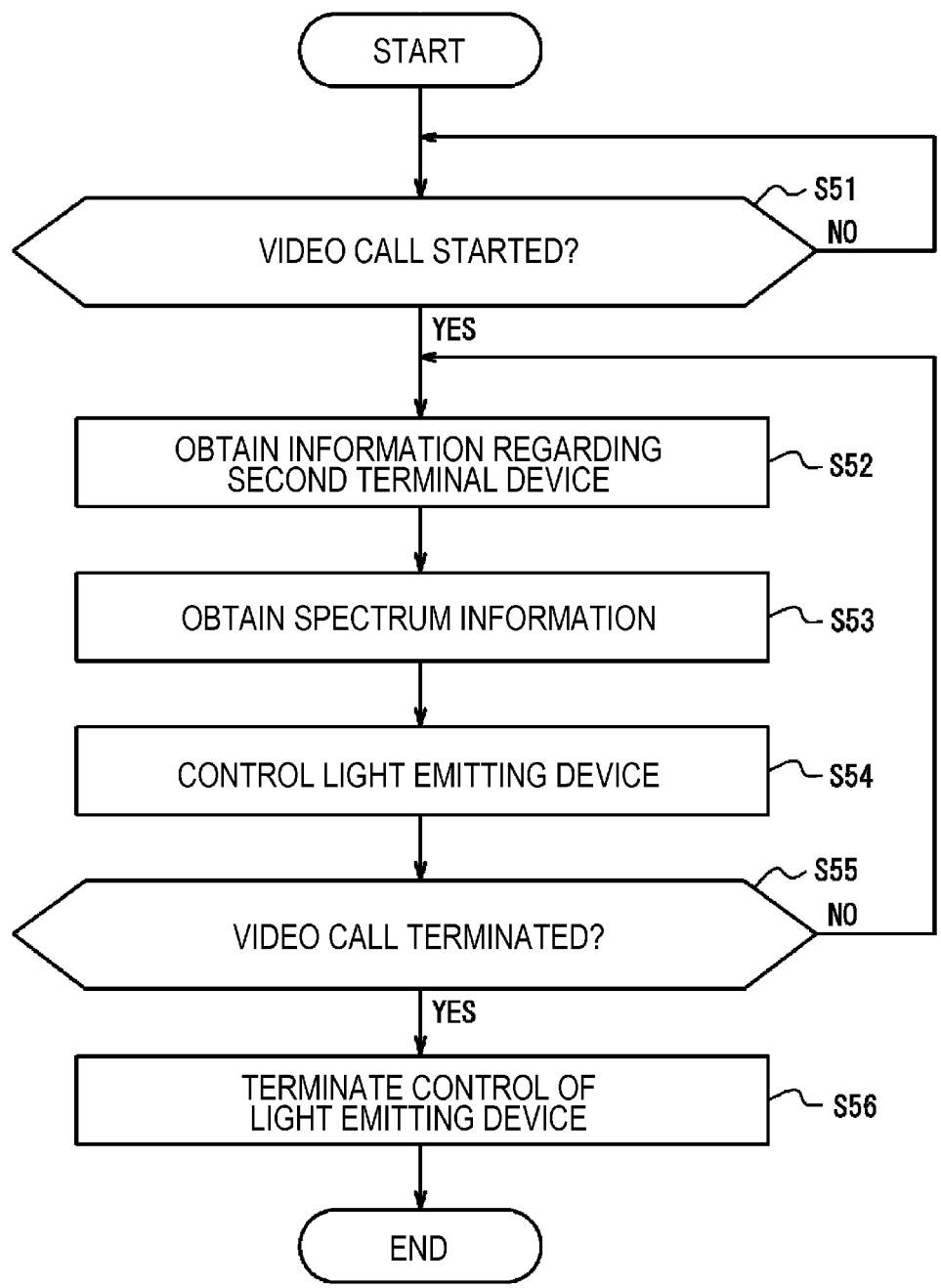
FIG. 20 is a flowchart illustrating an example procedure for controlling a spectrum on the basis of a video call made between the terminal devices.

The control unit 22 of the spectrum control device 20 may perform a spectrum control method including the procedure illustrated by the flowchart in FIG. 20. The spectrum control method may be implemented as the spectrum control program to be executed by the processor.

The control unit 22 determines whether the first terminal device 81 starts a video call (step S51). If the first terminal device 81 does not start a video call (NO in step S51), the control unit 22 repeats the procedure for determination in step S51.

If the first terminal device 81 starts a video call (YES in step S51), the control unit 22 obtains information regarding the second terminal device 82 (step S52). The information regarding the second terminal device 82 may include position information of the second terminal device 82. The information regarding the second terminal device 82 may include an image in the video call transmitted by the second terminal device 82.

The control unit 22 obtains spectrum information for identifying light to be emitted by the light emitting device 10, on the basis of the information regarding the second terminal device 82 (step S53). In a case where the information regarding the second terminal device 82 is an image in the video call, the control unit 22 may analyze the spectrum of light with which the second location space 72 is illuminated from the image to thereby obtain spectrum information. In a case where the information regarding the second terminal device 82 is position information of the second terminal device 82, the control unit 22 may extract environment information associated with a piece of spectrum data 110 on the basis of the position information and the current time and obtain spectrum information associated with the extracted environment information.

The control unit 22 controls the light emitting device 10 on the basis of the obtained spectrum information (step S54). The control unit 22 makes light emitted to the first location space 71 by the light emitting device 10 closer to light identified with the spectrum information.

The control unit 22 determines whether the first terminal device 81 terminates the video call (step S55). In a case where the first terminal device 81 continues the call but continues only the audio call, the control unit 22 determines that the video call ends. In a case where the first terminal device 81 hunts the entire call, the control unit 22 determines that the video call ends. If the first terminal device 81 does not terminate the video call (NO in step S55), that is, the video call continues, the flow returns to the procedure in step S52, and the control unit 22 continuously controls the light emitting device 10.

If the first terminal device 81 terminates the video call (YES in step S55), the control unit 22 terminates control of the light emitting device 10 (step S56). After the control unit 22 performs the procedure in step S56, the procedure illustrated by the flowchart in FIG. 20 ends. Even if the first terminal device 81 terminates the video call, the control unit 22 may continuously control the light emitting device 10 by extracting spectrum information on the basis of position information of the second terminal device 82 and the current time.

With the spectrum control system 1 according to this embodiment, in a call between the terminal devices 80, light rays with which spaces in which the users of the terminal devices 80 are present are illuminated can be made to match or made to be similar. Accordingly, the users who are making a call can have a feeling that they share a space. As a result, the spectrum control system 1 can give the users a feeling of unity or togetherness.

In this embodiment, the functions of the spectrum control device 20 may be executed by the terminal device 80. In this case, the terminal device 80 may generate control information for giving an instruction regarding the spectrum of light to be emitted by the light emitting device 10. That is, the light emitting device 10 may obtain the control information from the terminal device 80. In a case where the user of the terminal device 80 has moved to a room, the terminal device 80 may communicate with the light emitting device 10 in the room in which the user is present to thereby control the spectrum of light with which the room is illuminated. Accordingly, the system configuration can be simplified. As a result, the user's convenience can be increased.

The diagrams for describing the embodiments of the present disclosure are schematic diagrams. For example, the dimensions and ratios in the drawings do not necessary match the actual dimensions or ratios.

Although the embodiments of the present disclosure have been described with reference to the drawings and examples, it should be understood that a person skilled in the art can easily make various modifications or correction on the basis of the present disclosure. Therefore, it should be noted that such modifications or corrections are included in the scope of the present disclosure. For example, functions included in, for example, constituent units can be reconfigured so as not to cause any logical contradiction and, for example, a plurality of constituent units can be combined to form one constituent unit or one constituent unit can be divided.

In the present disclosure, the expressions of, for example "first" and "second" are identifiers for distinguishing the constituent elements from each other. For constituent elements distinguished from each other by the expressions of, for example, "first" and "second" in the present disclosure, the numbers given to the constituent elements can be exchanged. For example, for the first fluorescent substance, its identifier "first" can be exchanged with "second" that is the identifier of the second fluorescent substance. Identifiers are exchanged simultaneously. Even after the exchange of identifiers, the constituent elements are distinguished from each other. An identifier may be removed. A constituent element from which its identifier is removed is distinguished with a reference numeral. The expressions of identifiers, such as "first" and "second", in the present disclosure should not be used to interpret the order of the constituent elements or form a basis that an identifier of a smaller number is present.

REFERENCE SIGNS LIST 1 spectrum control system
10 light emitting device (2: element substrate, 2A: main surface, 3: light emitting element, 4: frame body, 5: sealing member, 6: wavelength conversion member, 60: translucent member, 61 to 65: first to fifth fluorescent substances)
20 spectrum control device (22: control unit, 24: storage unit, 26: interface)
30 measurement device
40 camera
50 display device (52: display control unit, 54: display storage unit, 55: operation unit, 56: display interface, 58: display unit)
71, 72 first location space, second location space
75 network
80 terminal device (81: first terminal device, 82: second terminal device, 83: terminal control unit, 84: terminal communication unit, 85: terminal operation unit, 86: terminal display unit, 87: camera, 88: audio input-output unit, 89: position information obtaining unit)
100 spectrum database
110 spectrum data

The invention claimed is:

1. A spectrum control device comprising
a control unit that obtains spectrum information of light, wherein
the control unit controls at least one of a spectrum of light emitted by a light emitting device or a spectrum of image light that forms an image, based on the spectrum information,
the light emitting device includes a first light emitting device and a second light emitting device, and
the control unit controls a spectrum of light emitted by the first light emitting device and a spectrum of light emitted by the second light emitting device such that a spectrum of light obtained by combining the light emitted by the first light emitting device and the light emitted by the second light emitting device matches a spectrum based on the spectrum information.

2. The spectrum control device according to claim 1, wherein the control unit obtains a spectrum measurement result regarding measurement target light as the spectrum information.

3. The spectrum control device according to claim 2, wherein the control unit causes the light emitting device to emit light having a spectrum of the measurement target light based on the spectrum measurement result regarding the measurement target light.

4. The spectrum control device according to claim 2, wherein the control unit generates an image by converting a spectrum of image light of a capture image of a subject illuminated with the measurement target light based on the spectrum measurement result regarding the measurement target light and information for identifying a spectrum different from the spectrum of the measurement target light.

5. The spectrum control device according to claim 1, wherein the control unit obtains spectrum data in which the spectrum information and environment information for identifying an environment illuminated with the light identified with the spectrum information are associated with each other, and controls at least one of the spectrum of the light emitted by the light emitting device or the spectrum of the image light that forms the image, based on the spectrum data.

6. The spectrum control device according to claim 5, wherein the control unit obtains as the environment information, measurement environment information for identifying an environment in which a spectrum measurement result regarding a measurement target light is obtained, and generates the spectrum data by associating the spectrum measurement result regarding the measurement target light, the spectrum measurement result being the spectrum information, and the measurement environment information with each other.

7. The spectrum control device according to claim 6, wherein the measurement environment information includes information for identifying a time when the spectrum measurement result is obtained.

8. The spectrum control device according to claim 7, wherein the time when the spectrum measurement result is obtained is identified with at least one of a date, a time, or a season.

9. The spectrum control device according to claim 6, wherein the measurement environment information includes information for identifying a place where the spectrum measurement result is obtained.

10. The spectrum control device according to claim 9, wherein the place where the spectrum measurement result is obtained is identified based on whether the place is an outdoor place or an indoor place.

11. The spectrum control device according to claim 9, wherein the place where the spectrum measurement result is obtained is identified with at least one of a region, an altitude, a latitude, or a longitude.

12. The spectrum control device according to claim 6, wherein the measurement environment information includes information for identifying weather when the spectrum measurement result is obtained.

13. The spectrum control device according to claim 6, wherein the control unit causes the light emitting device to emit light with which a reproduced environment is illuminated, based on information for identifying the reproduced environment and the spectrum data.

14. The spectrum control device according to claim 6, wherein the control unit generates an image by converting a spectrum of image light of a capture image of a subject illuminated with light identified with image-capture spectrum information based on the image-capture spectrum information, information for identifying a reproduced environment, and the spectrum data.

15. The spectrum control device according to claim 13, wherein the information for identifying the reproduced environment includes at least one of information for identifying a time, information for identifying a place, or information for identifying weather.

16. The spectrum control device according to claim 1, wherein based on a measurement result regarding the spectrum of the light emitted by the light emitting device, the control unit makes the measurement result closer to a spectrum identified with the spectrum information.

17. A spectrum control device comprising
a control unit that obtains spectrum information of light, wherein
the control unit controls at least one of a spectrum of light emitted by a light emitting device or a spectrum of image light that forms an image, based on the spectrum information,
the light emitting device includes
a light emitting element that emits light having a peak wavelength in a wavelength range of 360 nm to 430 nm, and
a wavelength conversion member that converts the light emitted by the light emitting element to light having a peak wavelength in a wavelength range of 360 nm to 780 nm.

18. A spectrum control device comprising
a control unit that obtains spectrum information of light, wherein
the control unit controls at least one of a spectrum of light emitted by a light emitting device or a spectrum of image light that forms an image, based on the spectrum information,
the control unit obtains spectrum data in which the spectrum information and environment information for identifying an environment illuminated with the light identified with the spectrum information are associated with each other, and controls at least one of the spectrum of the light emitted by the light emitting device or the spectrum of the image light that forms the image based on the spectrum data,
the control unit obtains as the environment information, measurement environment information for identifying an environment in which a spectrum measurement result regarding a measurement target light is obtained, and generates the spectrum data by associating the spectrum measurement result regarding the measurement target light, the spectrum measurement result being the spectrum information, and the measurement environment information with each other, and
the control unit causes the light emitting device to emit light with which a reproduced environment is illuminated, based on information for identifying the reproduced environment and the spectrum data.

* * * * *